United States Patent [19]

Mori

[11] Patent Number: 5,574,683
[45] Date of Patent: Nov. 12, 1996

[54] MEMORY DEVICE AND A METHOD FOR WRITING INFORMATION IN THE MEMORY DEVICE

[75] Inventor: Toshihiko Mori, Kawasaki, Japan

[73] Assignee: Fujitsu Limited, Kanagawa, Japan

[21] Appl. No.: 411,302

[22] Filed: Mar. 27, 1995

[30] Foreign Application Priority Data

May 16, 1994 [JP] Japan .................................. 6-100504

[51] Int. Cl.⁶ .................................................... G11C 13/00
[52] U.S. Cl. ...................... 365/179; 365/174; 365/189.01
[58] Field of Search ...................................... 365/179, 182, 365/189.01, 174, 189.05

[56] References Cited

U.S. PATENT DOCUMENTS 5,216,630  1/1993  Nakase ..................................... 365/179
5,311,465  5/1994  Mori et al. .............................. 365/179

FOREIGN PATENT DOCUMENTS 5-235291  9/1993  Japan .

Primary Examiner—Terrell W. Fears
Attorney, Agent, or Firm—Armstrong, Westerman, Hattori, McLeland & Naughton

[57] ABSTRACT

A memory device comprises a row address signal line Ax, a pair of column address signal lines Ay1, Ay2, a standby signal line Sb, a memory cell provided at an area where the row address signal line Ax intersects with the column address signal lines Ay1, Ay2, and a row address signal line driver BD provided on one end of the row address signal line. The row address signal line driver BD comprises a driver transistor BDTr of a double-emitter type, driver transistor BDTr including one collector electrode CBD, and two emitter electrodes of different areas and exhibiting negative differential characteristics. The smaller-area emitter electrode EBD1 is grounded, and the collector electrode CBD is connected to the row address signal line Ax. The driver transistor BDTr constituting the row address signal line driver BD comprises a transistor of the same structure as a transistor Tr of the memory cell, whereby a voltage of the holding state can be set at 0, and a voltage set for writing when the memory device is at a stable operating point S1 or S2 can have equal positive and negative values. Accordingly, the memory device can have a smaller number of devices and take a smaller area, and the memory cells and peripheral circuits can be easily designed.

34 Claims, 32 Drawing Sheets

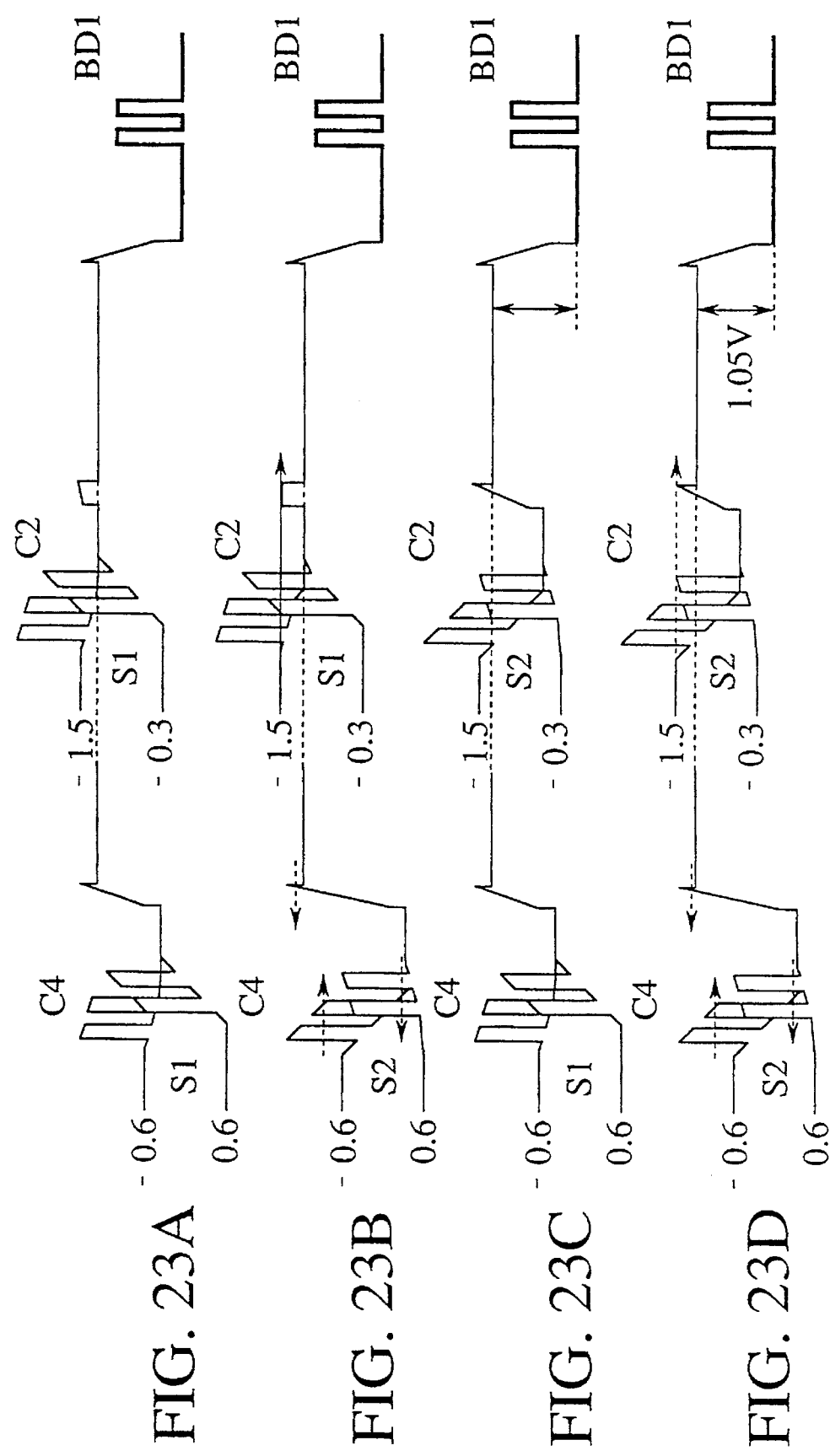

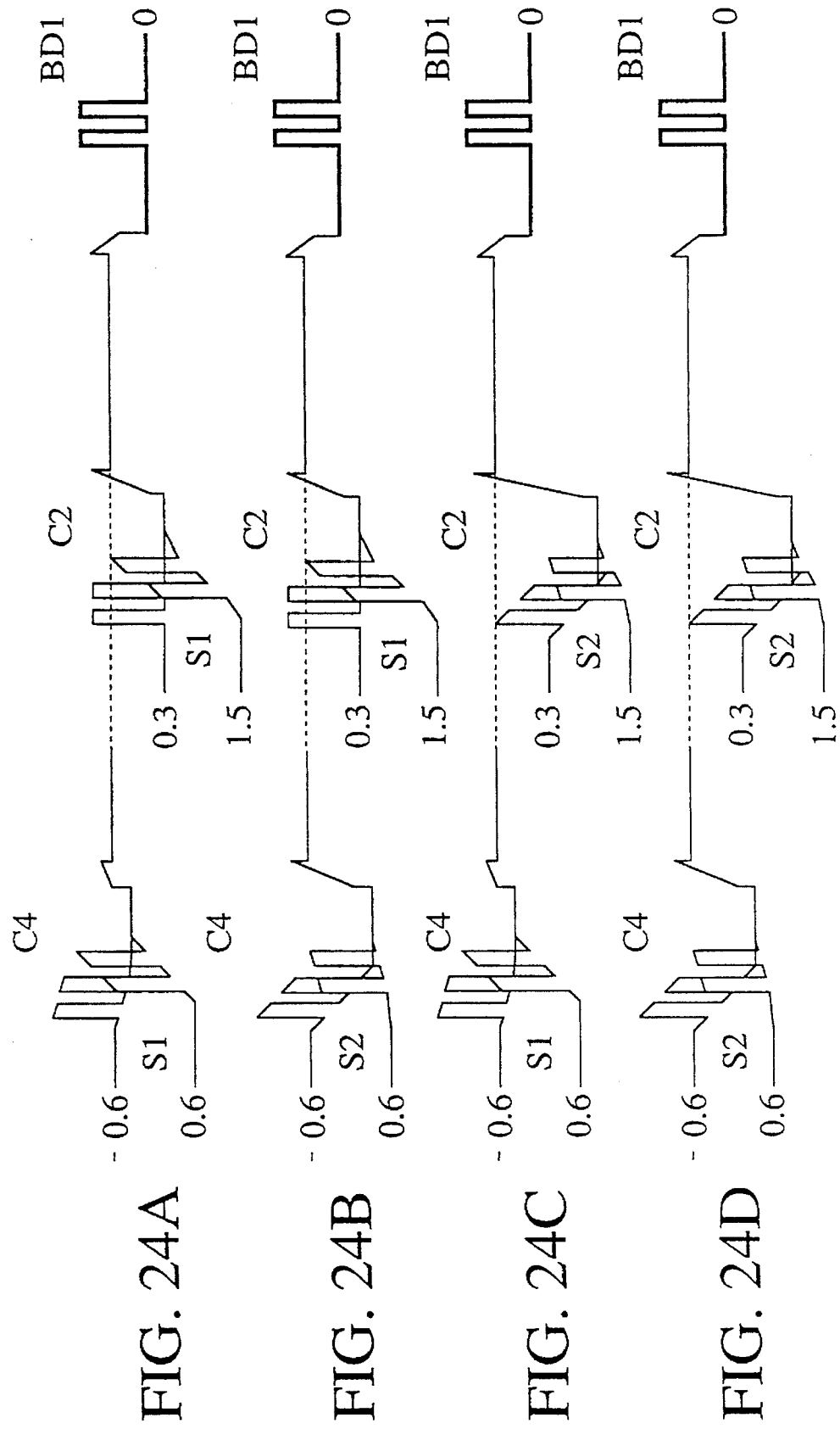

MEMORY DEVICE AND A METHOD FOR WRITING INFORMATION IN THE MEMORY DEVICE

BACKGROUND OF THE INVENTION

The present invention relates to a memory device which is suitable for use as a SRAM (Static Random Access Memory), etc., and more particularly to a memory device that uses as a memory cell a transistor, such as an RHET (Resonant-tunneling Hot Electron Transistor), an RBT (Resonance Bipolar Transistor), or others, having negative differential and threshold characteristics, a method for reading information from the memory device, and a method for writing information in the memory device.

Semiconductor memories have been increasingly large-scaled in recent years, and 64 Mb-DRAMs (Dynamic Random Access Memories) and 16 Mb-SRAMs have been developed. However, the presently used memory cell structures are a limit to higher densities of the semiconductor memories. Novel semiconductor memory cells which will enable higher densities for semiconductor memories are expected.

In general, each memory cell of a DRAM includes a capacitor utilizing the junction capacitance of a FET (Field Effect Transistor) for storage of information, and a FET which writes/reads information in/from the capacitor. A SRAM uses a flip-flop memory cell structure and usually includes six FETs.

Thus, a SRAM requires an area for at least 6 FETs. This is a limit to further miniaturization of the SRAM.

SUMMARY OF THE INVENTION

An object of the present invention is to provide a memory device which is an improvement of the memory device proposed in Japanese Patent Application No. 256702/1992, filed by the same applicant of the present application, includes a smaller number of devices and accordingly occupies a smaller area, additionally includes row address signal line drivers of the same structure as the memory cells, the memory cells and peripheral circuits of which can be easily designed, and to provide a method for writing information in the memory device.

The above-described object of the present invention is achieved by a memory device comprising a row address signal line (Ax); a pair of column address signal lines (Ay1, Ay2); a memory cell provided at an area where the row address signal line (Ax) intersects with the column address signal lines (Ay1, Ay2); and a row address signal line driver (BD) provided at one end of the row address signal lines (Ax),the memory cell comprising a memory transistor (Tr) of double-emitter structure including one collector electrode (C) and emitter electrodes (E1, E2), and exhibiting negative differential characteristic; one of the emitter electrodes (E1) of the memory transistor (Tr) being connected to one of the column address signal lines (Ay1) which is on a lower-voltage side, the other of the emitter electrodes (E2) being connected to the other of the column address signal lines (Ay2) which is on a higher-voltage side, the collector electrode (C) of the memory transistor (Tr) being connected to the address signal line (Ax); the row address signal line driver (BD) comprising a driver transistor (BDTr) of a double-emitter structure which includes one collector electrode (CBD), and a smaller-area emitter electrode (EBD1) and a larger-area emitter electrode (EBD2), and exhibits a negative differential characteristic; and the smaller-area emitter electrode (EBD1) of the driver transistor (BDTr) being grounded, and the collector electrode (CBD) of the driver transistor (BDTr) being connected to the row address signal line (Ax).

The above-described object of the present invention is also achieved by a memory device comprising row address signal line (Ax); pairs of column address signal lines (Ay1, Ay2); a memory cell provided at an area where the row address signal line (Ax) intersects with the column address signal lines (Ay1, Ay2); and a first row address signal line driver (BD1) and a second row address signal line driver (BD2) provided at one end of the row address signal line (Ax), the memory cell comprising a memory transistor (Tr) of double-emitter structure each including one collector electrode (C) and emitter electrodes (E1, E2), and exhibiting negative differential characteristic; one of the emitter electrodes (E1) of the memory transistor (Tr) being connected to one (Ay1) of the column address signal lines which is on a lower-voltage side, the other (E2) of the emitter electrodes being connected to the other (Ay2) of the column address signal lines which is on a higher-voltage side, the collector electrode (C) of the memory transistor (Tr) being connected to the address signal line (Ax); the first row address signal line driver (BD1) comprising a first driver transistor (BDTr1) of a double-emitter structure which includes one collector electrode (CBD1), and a smaller-area emitter electrode (EBD11) and a larger-area emitter electrode (EBD21), and exhibits a negative differential characteristic; the smaller-area emitter electrode (EBD11) of the first driver transistor (BDTr1) being grounded, and the collector electrode (CBD1) of the driver transistor (BDTr1) being connected to the row address signal line (Ax); the second row address signal line driver (BD2) being the same as the first row address signal line driver (BD1), and comprising a second driver transistor (BDTr2) of a double-emitter structure which includes one collector electrode (CBD2), and a smaller-area emitter electrode (EBD12) and a larger-area emitter electrode (EBD22), and exhibits a negative differential characteristic; and the smaller-area emitter electrode (EBD12) of the second driver transistor (BDTr2) being grounded, and the collector electrode (CBD2) of the second driver transistor (BDTr2) being connected to the row address signal line (Ax).

It is preferable that the above-described memory device further comprises a gate control signal line (SbBD) for controlling a base current of the driver transistor (BDTr), the row address signal line driver (BD) further includes a gate which is provided in said one emitter electrode (EBD1), and changes an effective area of said one emitter electrode (EBD1) by an applied voltage, the gate (GBD) being connected to the gate control signal line (SbBD).

It is preferable that the above-described memory device further comprises a gate control signal line (SbBD) for controlling base currents of the first driver transistor (BDTr1) and of the second driver transistor (BDTr2); the first row address signal line driver (BD1) further includes a gate (GBD1) which is provided in said one emitter (EBD11), and changes an effective area of said one emitter electrode (EBD11) by an applied voltage, the gate (GBD1) being connected to the gate control signal line (SbBD), the second row address signal line driver (BD2) further includes a gate (GBD2) which is provided in said one emitter (EBD12), and changes an effective area of said one emitter electrode (EBD12) by an applied voltage, the gate (GBD2) being connected to the gate control signal line (SbBD).

It is preferable that the above-described memory device further comprises a standby signal line (Sb); the memory cell further includes a gate (G) which controls a base current of the memory transistor (Tr) by an applied voltage; and the gate (G) being connected to the standby signal line (Sb).

In the above-described memory device, it is preferable that the driver transistor (BDTr) comprises a double-emitter type resonant tunneling hot electron transistor (RHET).

In the above-described memory device, it is preferable that the driver transistor (BDTr) comprises a double-emitter type resonant tunneling bipolar transistor (RBT).

The above-described object of the present invention is also achieved by a method for writing information in the above-described memory device in which when information is written in stable operating point (S1), on the negative side of two stable and unstable operating points generated by base-emitter junction layers (D1, D2) of the memory cell, a low-level voltage (Low) is applied to the larger-area emitter electrode (EBD2) so that emitter electrodes (EBD1, EBD2) of the driver transistor (BDTr) have a bistable state, and a high-level voltage (High) is applied to the row address signal lines (Ay1, Ay2); when information is written in stable operating point (S2), on the positive side of said stable operating points, a high-level voltage (High) is applied to the larger-area emitter electrode (EBD2) so that the emitter electrodes (EBD1, EBD2) of the first driver transistor (BDTr) have a bistable state, and a low-level voltage (Low) is applied to the row address signal lines (Ay1, Ay2).

The above-described object of the present invention is also achieved by a method for writing information in the above-described memory device, wherein when information is written in stable operating point (S1), on the negative side of two stable and one unstable operating points generated by base-emitter junction layers (D1, D2) of the memory cell, a low-level voltage (Low) is applied to the larger-area emitter electrode (EBD21) so that the emitter electrodes (EBD11, EBD21) of the first driver transistor (BDTr1) have a bistable state, and a high-level voltage (High) is applied to the row address signal lines (Ay1, Ay2); when information is written in stable operating point (S2), on the positive side, of said stable operating points, a high-level voltage (High) is applied to the larger-area emitter electrode (EBD22) so that the emitter electrodes (EBD12, EBD22) of the second driver transistor (BDTr2) have a bistable state, and a low-level voltage (Low) is applied to the row address signal lines (Ay1, Ay2).

The above-described object of the present invention is also achieved by a method for writing information in the above-described memory device, wherein when information is written in stable operating point (S1), on the negative side of two stable and one unstable operating points generated by base-emitter junction layers (D1, D2) of the memory cell, a negative voltage is applied to the gate control signal line (SbBD), a low-level voltage (Low) is applied to the effectively larger-area emitter electrode (EBD2) so that the two emitter electrodes (EBD1, EBD2) of the driver transistor (BDTr) have a bistable state, and a high-level voltage (High) is applied to the row address signal lines (Ay1, Ay2); when information is written in stable operating point (S2), on the positive side of said stable operating points, a negative voltage is applied to the gate control signal line (SbBD), a high-level voltage (High) is applied to the effectively larger-area emitter electrode (EBD2) so that the emitter electrodes (EBD1, EBD2) of the driver transistor (BDTr) have a bistable state, and a low-level voltage (Low) is applied to the row address signal lines (Ay1, Ay2).

The above-described object of the present invention is also achieved by a method for writing information in the above-described memory device, wherein when information is written in stable operating point (S1), on the negative side of two stable and one unstable operating points generated by base-emitter junction layers (D1, D2) of the memory cell, a negative voltage is applied to the gate control signal line (SbBD1), a low-level voltage (Low) is applied to the effectively larger-area emitter electrode (EBD21) so that the two emitter electrodes (EBD11, EBD21) of the first driver transistor (BDTr1) have a bistable state, and a high-level voltage (High) is applied to the row address signal lines (Ay1, Ay2); when information is written in stable operating point (S2), on the positive side of said stable operating points, a negative voltage is applied to the gate control signal line (SbBD2), a high-level voltage (High) is applied to the effectively larger-area emitter electrode (EBD22) so that the two emitter electrodes (EBD12, EBD22) of the second driver transistor (BDTr2) have a bistable state, and a low-level voltage (Low) is applied to the row address signal lines (Ay1, Ay2).

The above-described object of the present invention is also achieved by a memory device comprising: row address signal lines (Ax1, Ax2, . . . ) comprising a plurality of signal lines; column address signal lines (Ay11, Ay21, . . . , Ay12, Ay22, . . . ) comprising pairs of signal lines arranged across the row address signal lines (Ax1, Ax2, . . . ); a plurality of memory cells provided at respective areas where the row address signal lines (Ax1, Ax2, . . . ) intersect with the column address signal lines (Ay11, Ay21, . . . , Ay12, Ay22, . . . ), respective memory cell comprising a memory transistor (Tr) of double-emitter structure including one collector electrode (C) and emitter electrodes (E1, E2), and exhibiting negative differential characteristic, one of the emitter electrodes (E1) of the memory transistor (Tr) being connected to one of the respective column address signal lines (Ay11, Ay21, . . . ) which is on a lower-voltage side, the other of the emitter electrodes (E2) being connected to the other of the respective column address signal lines (Ay12, Ay22, . . . ) which is on a higher-voltage side, the collector electrode (C) of the memory transistor (Tr) being connected to the respective address signal line (Ax1, Ax2, . . . ); a plurality of above-described row address signal line drivers (BD) provided on one end of the row address signal lines; a row address decoder (1) for supplying row address signals to the row address signal lines (Ax1, Ax2, . . . ); a column address decoder (2) for supplying column address signals to the column address signal lines (Ay11, Ay21, . . . , Ay12, Ay22, . . . ); and a sense circuit (3) for detecting stored information in the respective memory cells from the row address signal lines (Ax1, Ax2, . . . ).

The above-described object of the present invention is also achieved by a memory device comprising: row address signal line (Ax); pairs of column address signal lines (Ay1, Ay2); a memory cell provided at an area where the row address signal line (Ax) intersects with the column address signal lines (Ay1, Ay2); and a first row address signal line driver (BD1) and a second row address signal line driver (BD2) provided at one end of the row address signal line (Ax), the memory cell comprising a memory transistor (Tr) of double-emitter structure each including one collector electrode (C) and emitter electrodes (E1, E2), and exhibiting negative differential characteristic; one of the emitter electrodes (E1) of the memory transistor (Tr) being connected to one (Ay1) of the column address signal lines which is on a lower-voltage side, the other (E2) of the emitter electrodes being connected to the other (Ay2) of the column address signal lines which is on a higher-voltage side, the collector electrode (C) of the memory transistor (Tr) being connected to the address signal line (Ax); the first row address signal line driver (BD1) comprising a first driver transistor (BDTr1) of a double-emitter structure which includes one collector electrode (CBD1), a first emitter electrode (EBD11) and a second emitter electrode (EBD21), and a base layer, and exhibits a negative differential characteristic; a peak current of negative differential characteristics of the second emitter when the second emitter electrode is biased negative related to the base layer being larger than that of the first emitter when the first emitter electrode is biased positive related to the base layer; the collector electrode (CBD1) of the driver transistor (BDTr1) being connected to the row address signal line (Ax); the second row address signal line driver (BD2) being the same as the first row address signal line driver (BD1), and comprising a second driver transistor (BDTr2) of a double-emitter structure which includes one collector electrode (CBD2), a first emitter electrode (EBD12) and a second emitter electrode (EBD22), and a base layer, and exhibits a negative differential characteristic; a peak current of negative differential characteristics of the second emitter when the second emitter electrode is biased positive related to the base layer being larger than that of the first emitter when the first emitter electrode is biased negative related to the base layer; and the collector electrode (CBD2) of the second driver transistor (BDTr2) being connected to the row address signal line (Ax).

It is preferable that the above-described method for writing information in a memory device wherein when information is written in stable operating point (S1), on the negative side of two stable and one unstable operating points generated by base-emitter junction layers (D1, D2) of the memory cell, a low-level voltage (Low) is applied to the second emitter electrode (EBD21) so that the emitter electrodes (EBD11, EBD21) of the first driver transistor (BDTr1) have a bistable state, and a high-level voltage (High) is applied to the row address signal lines (Ay1, Ay2); when information is written in stable operating point (S2), on the positive side, of said stable operating points, a high-level voltage (High) is applied to the second emitter electrode (EBD22) so that the emitter electrodes (EBD12, EBD22) of the second driver transistor (BDTr2) have a bistable state, and a low-level voltage (Low) is applied to the row address signal lines (Ay1, Ay2).

The transistor constituting the row address signal line driver (bit line driver BD) comprises a transistor of the same structure as a transistor of the memory cell, whereby a voltage of its holding state can be set at 0, and a voltage can be set for writing having an equal positive and negative value, where the memory state is at a stable operating point S1 or S2. This facilitates design of the circuit.

Two row address signal line drivers of the same structure as the transistor constituting the memory cell are provided on the row address signal lines Ax, whereby when a memory cell is written-in, attaining a state corresponding to a stable operating point S1 or S2, one of the row address signal line drivers can be operated at two voltage levels, a middle-level voltage (Mid) and a low-level voltage (Low). At the same time, the other row address signal line drivers can also be operated at two voltage levels, the middle-level voltage (Mid) and a high-level voltage (High). Therefore, the row address decoder can be more easily designed in comparison with the design of conventional row address decoders, which are operated at three voltage levels.

BRIEF DESCRIPTION OF THE DRAWINGS

FIGS. 23A to 23D are views illustrating energy band structures of the memory cell and the row address signal line driver obtained when the column address signal lines are selectively at a low-level voltage.

FIGS. 24A to 24D are views illustrating energy band structures of the memory cell and the row address signal line driver obtained when the column address signal lines are selectively at a high-level voltage.

DETAILED DESCRIPTION OF THE PREFERRED EMBODIMENTS

Preferred embodiments of the present invention will be explained with reference to the drawings.

[I] Memory Cell (i) Circuitry of the Memory Cell

Figure 1:
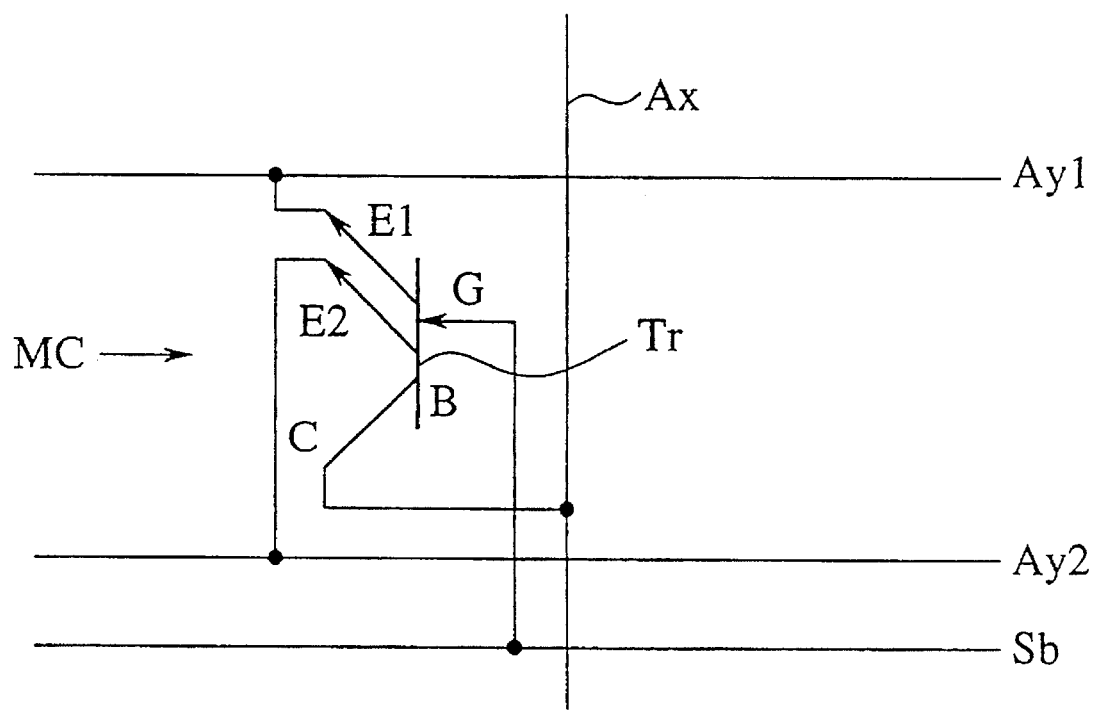
FIG. 1 is an equivalent circuit diagram of a memory cell of the memory device according to the present invention.

As shown in FIG. 1, a row address signal line Ax is arranged in the row direction (X), and a pair of column address signal lines Ay1, Ay2 are arranged crossing the row address signal line Ax. A standby signal line Sb is arranged parallel with the column address signal lines Ay1, Ay2.

The column address signal line Ay1 is connected to a first emitter E1 of a transistor Tr which is to be a memory cell, and the column address signal line Ay2 is connected to a second emitter E2. The collector C of the transistor Tr is connected to the row address signal line Ax. A gate G which controls the base current of the transistor Tr is connected to the standby signal line Sb. Thus the memory cell comprises the transistor Tr and the gate G.

The transistor Tr has a double emitter structure and comprises a device having a resonant tunneling structure, such as an RHET, RBT, or others. In the following description, a base-to-first emitter junction BE1 is represented by D1, a base-to-second emitter junction BE2 is represented by D2, and a base-to-collector junction is represented by D3.

Figure 2:
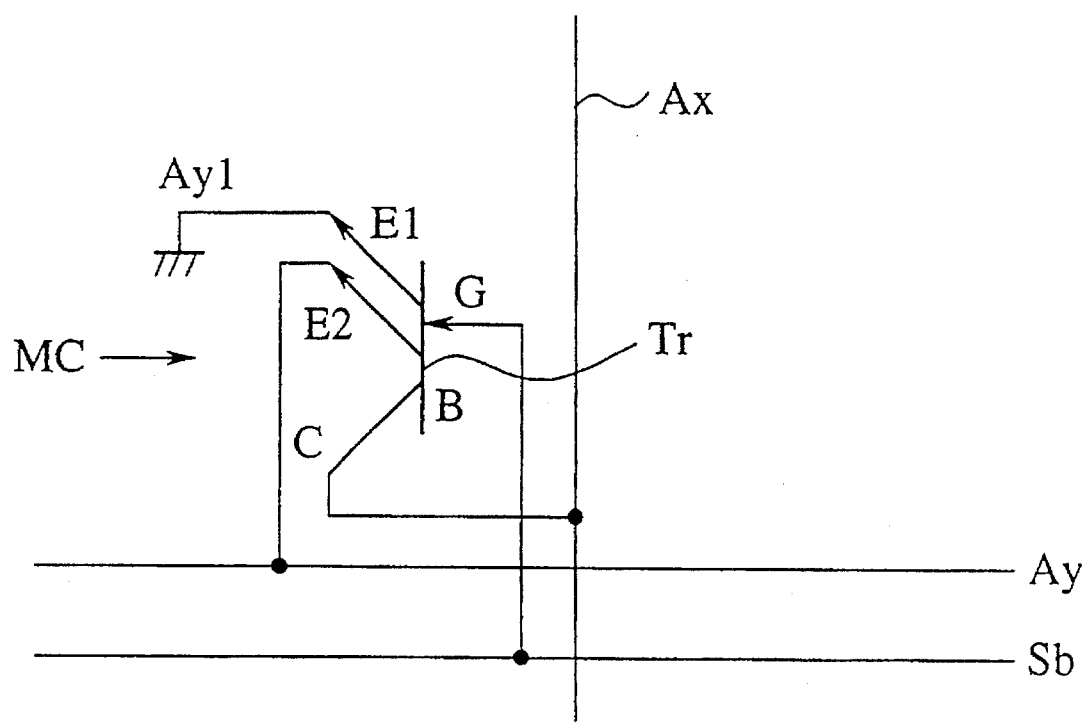
FIG. 2 is an equivalent circuit diagram of another memory cell of the memory device according to the present invention.

FIG. 2 shows an example where one of the column address lines Ay1 has a ground potential GND.

(ii) Operation Principles of the Memory Cell

Figure 3A:
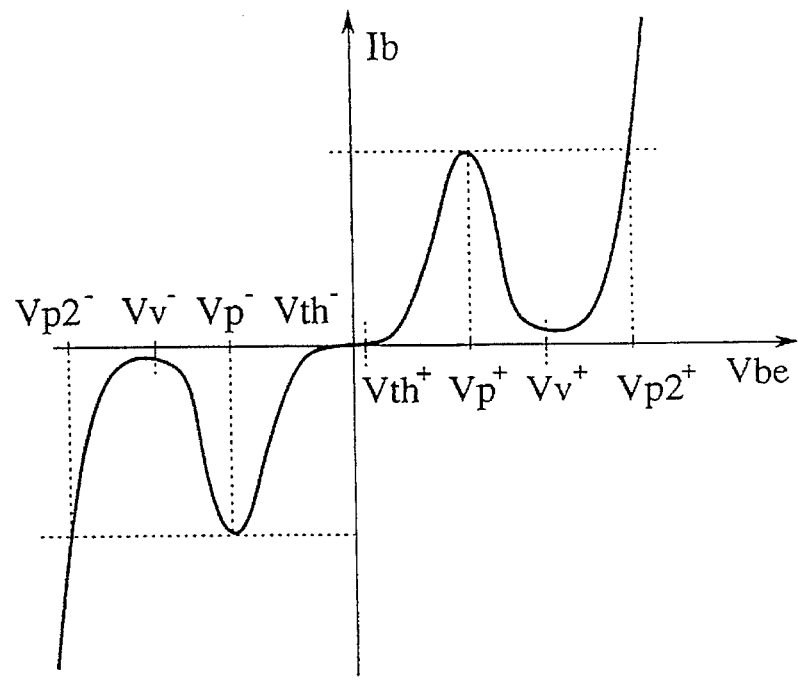
FIGS. 3A and 3B are diagrams of characteristic curves showing the base-emitter voltage dependency of the base current.
Figure 3B:
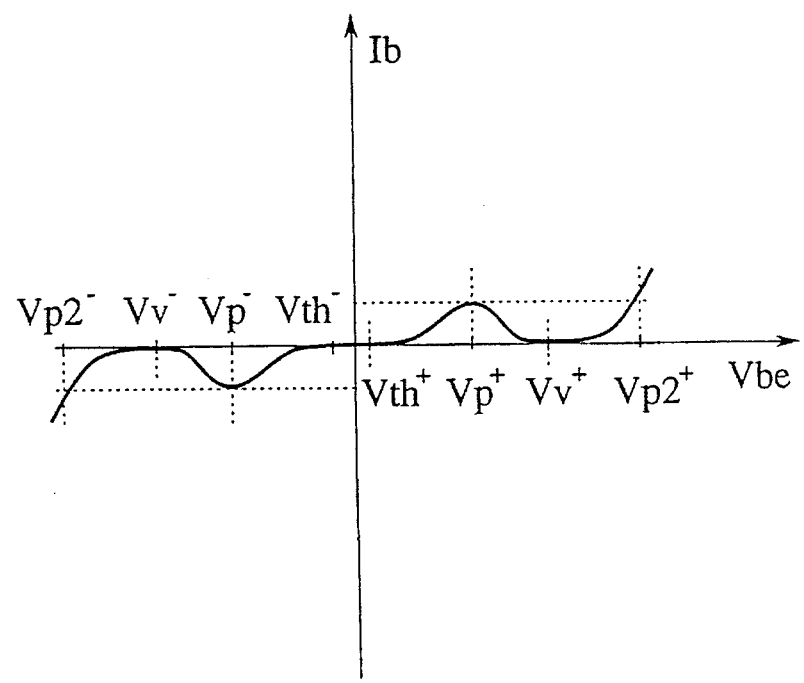

The base current-voltage characteristics, based on the grounded-emitter configuration, of the RHET are shown in FIGS. 3A and 3B. FIG. 3A shows the case where no voltage is applied to the standby signal line Sb, i.e., the gate G has a voltage of 0, and a current flowing through the base-emitter junction layers D1, D2 is not changed. FIG. 3B shows the case where a predetermined negative voltage is applied to the standby signal line Sb, i.e., the gate has a negative voltage, and a current flowing through the base-emitter junction layers D1, D2 is decreased by a depletion layer extended from the gate G.

A peak current is represented by Ip; a valley current, by Iv; a threshold voltage, by Vth; a peak voltage, by Vp; a valley voltage, by Vv; and a voltage at which current resumes flowing and flows as a peak current, by Vp2. The suffix+ is added to a base voltage on the positive side, and the suffix− is added to a base voltage on the negative side.

Figure 4:
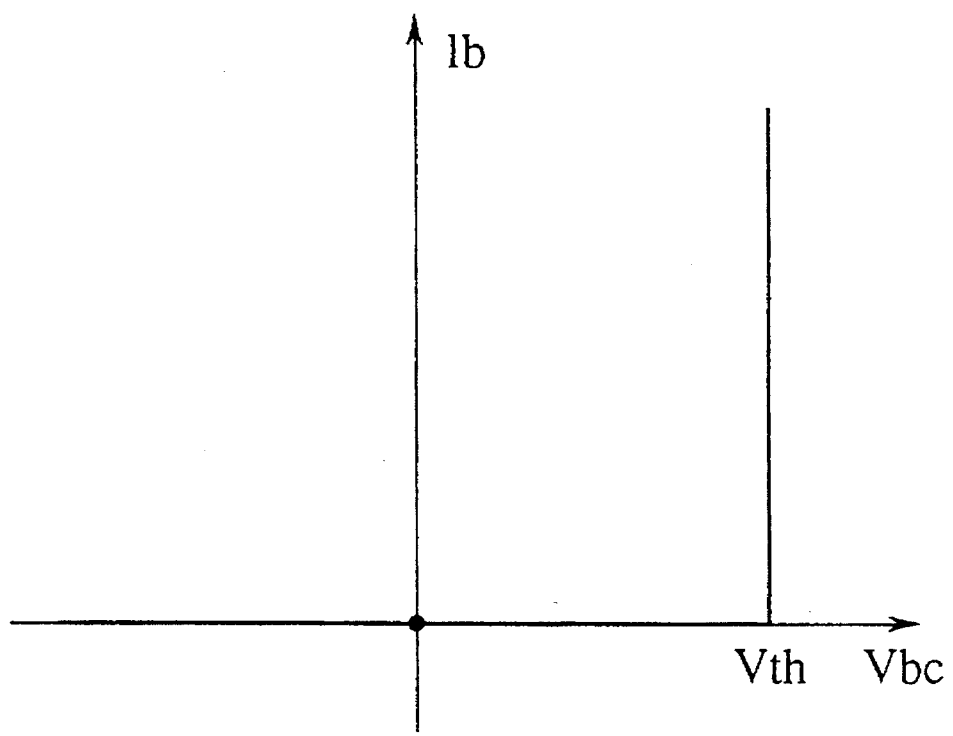
FIG. 4 is a diagram of characteristic curve showing base-collector voltage dependency of the base current.

Base-collector current-voltage characteristics are shown in FIG. 4. When the voltage exceeds a threshold voltage Vth, current abruptly flows.

The operating principle of the memory cell will be explained with reference to FIGS. 5A to 8B. For better understanding of the explanation, the gate G has a voltage of 0.

Figure 5A:
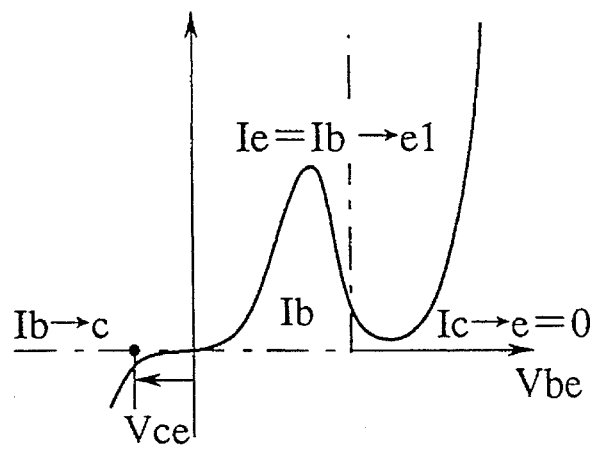
FIGS. 5A and 5B are explanatory views of the principle of operation of the memory cell.
Figure 5B:
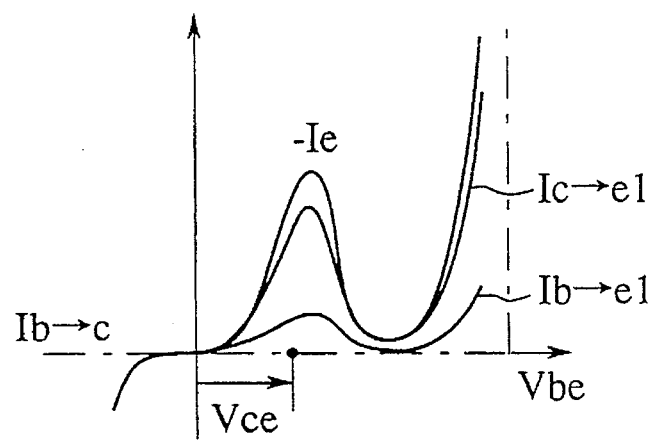

FIGS. 5A and 5B show base voltage variation depending on the base current of the grounded-emitter configuration. Here—Ie represents a current of electrons (—is added to a current injected at the emitter). Ib→e represents the component of a current of electrons injected into the base at the emitter and de-energized at the base to be a base current (the direction of Ib→e is from the base to the emitter). Ic→e represents the component of a current of electrons injected at the emitter to the base, which has arrived at the collector and becomes a collector current (the direction of Ic→e is from the collector to the emitter). Ib→c represents a base current of electrons flowing from the collector to the base through the collector barrier (the direction of Ib→c is from the base to the collector). Therefore, the base current Ib equals the sum of Ib→e+Ib→c.

The variation of the base voltage when a collector voltage is lower than the rise voltage Vr (a collector-emitter voltage at which a collector current begins to flow in the grounded-emitter configuration) is as show in FIG. 5A, which shows that all electrons injected at the emitter flow to the base. If the collector voltage rises higher than the voltage Vr, a portion of the electrons injected at the emitter arrive at the collector to be a current. Current-voltage characteristics of the base are as shown in FIG. 5B.

Figure 6A:
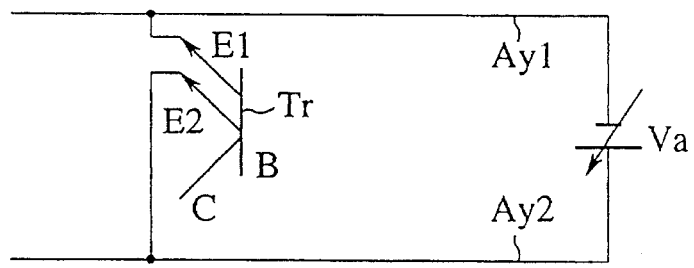
FIGS. 6A to 6C are explanatory views of the principle of operation of the memory cell.
Figure 6B:
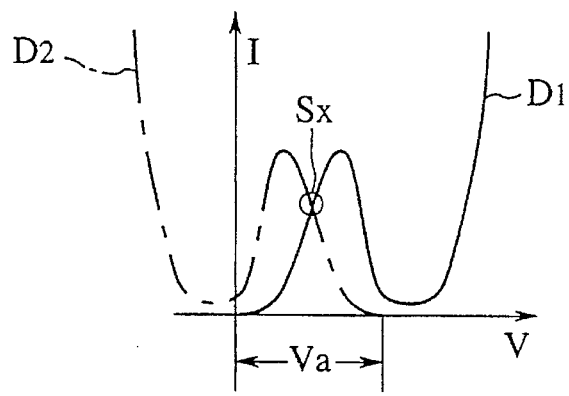
Figure 6C:
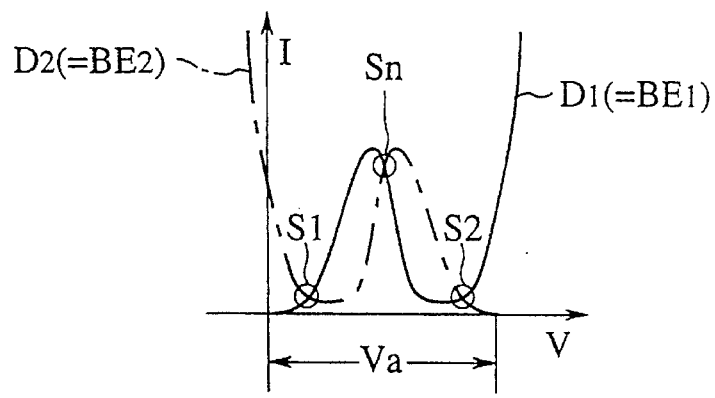

As shown in FIG. 6A, the emitter E1 is connected to the column address signal line Ay1, and the emitter E2 is connected to the column address signal line Ay2. As a voltage is increasingly applied between both column address signal lines, one stable operating point Sx is present until the applied voltage arrives at 2 Vp (FIG. 6B). But as the voltage is further increased, two stable operating points (S1, S2), and an unstable point (Sn) are attained (FIGS. 6B and 6C). At the stable point S1, a voltage applied between the first emitter E1 and the base is lower than a peak voltage, and a voltage applied between the second emitter E2 and the base B is higher than a valley voltage. This is opposite at the stable operating point S2. Memory is enabled depending on which of the stable operating points a voltage takes.

Figure 7A:
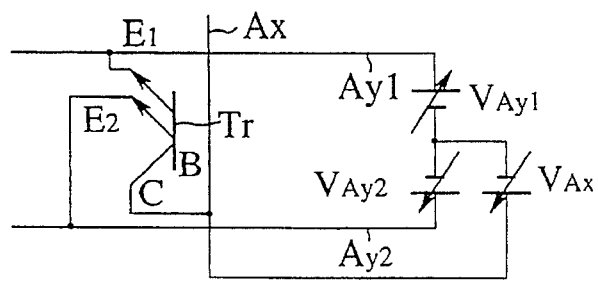
FIGS. 7A to 7D are explanatory views of the principle of operation of the memory cell.

As shown in FIG. 7A, the row address signal line Ax is connected to the collector in addition to the connection of the row address signal line Ax shown in FIG. 5A so that voltages VAx, VAy1 and VAy2 are respectively applied to the address signal lines Ax, Ay1, Ay2. FIGS. 7B, 7C and 7D, and FIG. 8A and B show, with respect to the base voltage: the current Ib→e1 which flows from the base to the first emitter E1; the current Ie2→b which flows from the second emitter E2 to the base; and, the current Ib→c which flows from the collector to the base (a current Ic→e1 which flows from the collector to the first emitter E1 is also shown for reference). Because the base current a position where Ib→e1=Ie2→b+Ic→c=0 is a stable operating point.

Figure 7B:
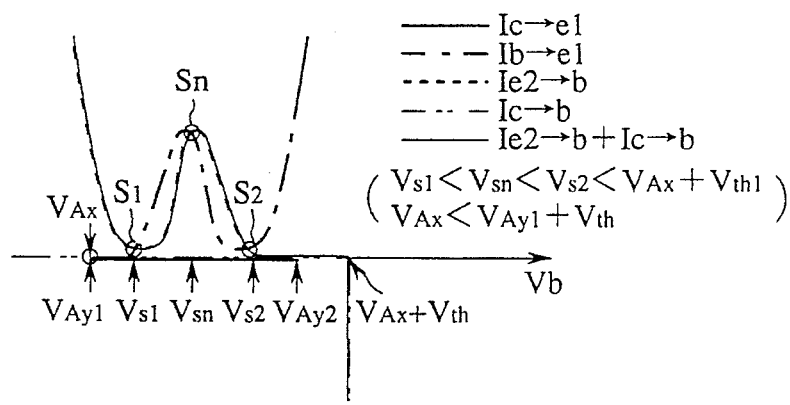
Figure 7C:
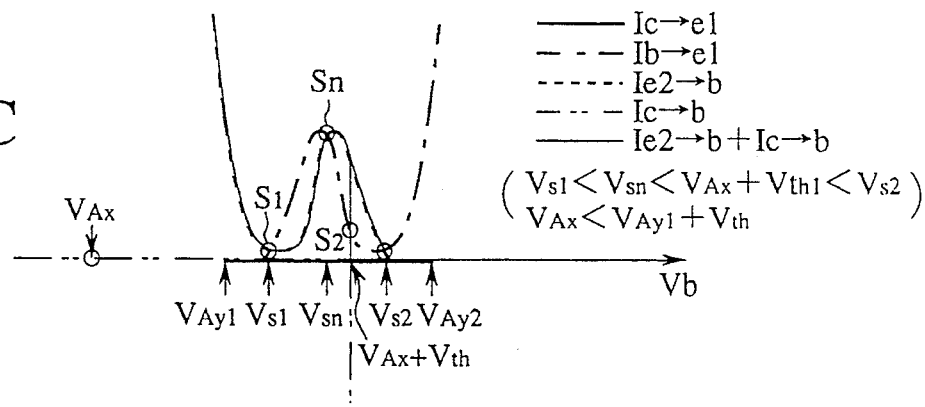
Figure 7D:
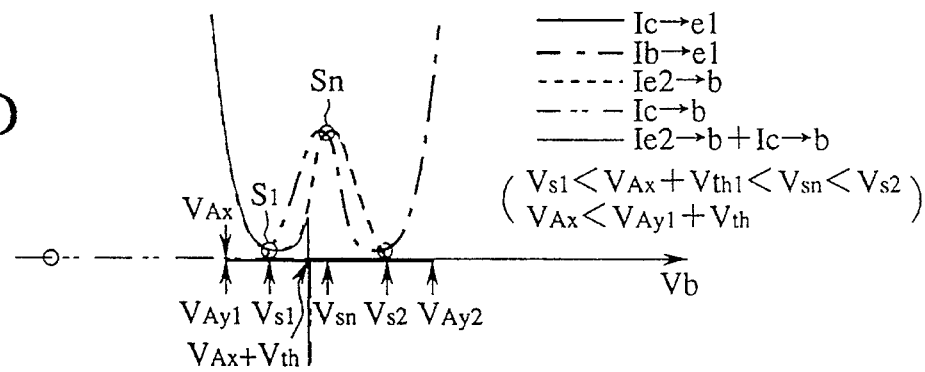
Figure 8A:
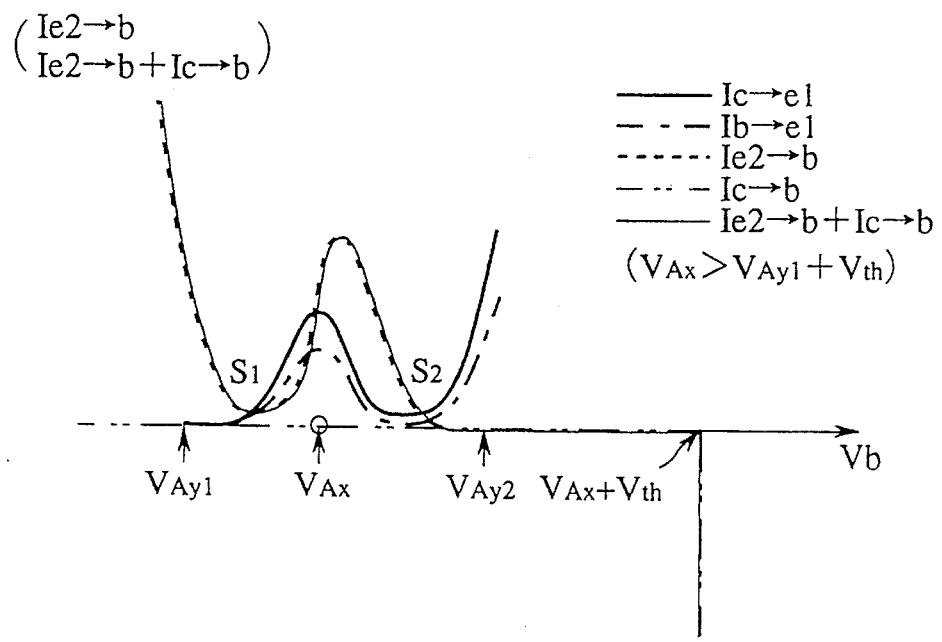
FIGS. 8A and 8B are explanatory views of the principle of operation of the memory cell.
Figure 8B:
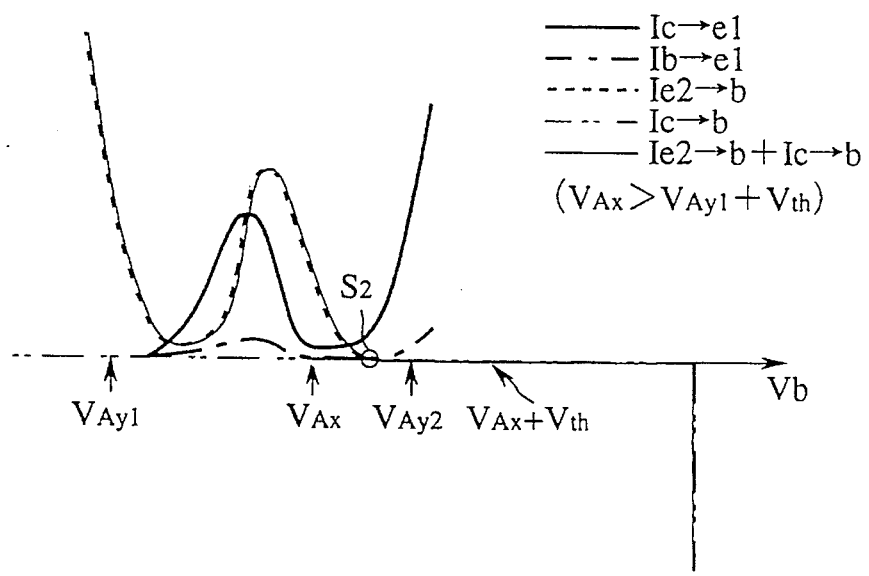

FIGS. 7B to 7D show the case where VAx<(VAy1+Vr), i.e., the transistor does not operate at a collector voltage lower than a first emitter voltage. FIGS. 8A and 8B show the case of VAx>(VAy1+Vr), i.e., the transistor operates at a collector voltage higher than a first emitter voltage. In both states Vy1<Vy2.

FIG. 7B is a characteristic view of the state where memory is held, i.e., (VAx+Vth)>Vs2. Two stable operating points are present, and besides, no current flows in the collector. FIG. 7C is a characteristic curve that occurs when the memory cell is read out depending on whether or not information has been written in the stable operating point S2, i.e., Vsn<(VAx+Vth)<Vs2. FIG. 7C indicates that two stable operating points are present, and in the memory state of stable operating point S2, current flows in the collector, but no current flows in the collector when in memory state of stable operating point S1.

FIG. 7D shows a characteristic curve that occurs when information is written when the memory state is at a stable operating point S1, i.e. (VAx+Vth)<Vsn. Only one stable operating point is present. It is shown that this stable operating point has the same nature as the stable operating point S1 because a voltage applied between the emitter E1 and the base is lower than a peak voltage. Thus, holding information, reading information when the memory state is at the stable operating point S2, and writing information when the memory state is at the stable operating point S2 can be enabled.

In comparing writing when the memory state is at the stable operating point S1, to writing when it is at stable operating point S2, as far as viewed in FIG. 7D, it seems that writing when the memory is in the stable operating point S2 cannot be conducted merely by raising the voltage VAx because the base-collector junction D3 has a positive threshold voltage but no negative threshold voltage (or, a very low threshold voltage if any). But when voltage VAx is raised, the memory cell operates as a transistor, and the characteristics are changed from those shown in FIGs. 7B, 7C, and 7D to those of FIGS. 8A and 8B.

When the memory cell is in the state shown in FIG. 8A, current which has flowed from the first emitter E1 flows out to the collector C, a part of this current flowing also to the second emitter E2. In the state in which the level VAx of the row address signal line Ax is not raised much, two stable operating points are still present, and writing cannot be conducted.

FIG. 8B shows a characteristic curve with the voltage VAx of the row address signal line Ax further raised. When voltage VAx is raised, gain is increased with VAx>(VAy1+Vr), and in addition, only one stable operating point S2 is present. As seen in FIG. 8B, the stable operating point S2 has the same nature as the above-described stable operating point S2 because the voltage applied between the emitter E2 and the base is lower than a peak voltage.

(iii) Holding of Stored Information

To hold memory, the state shown in FIG. 7B must be established. Since the lowest possible current flow will advantageously suppress consumption of electric power, a situation where the two stable operating points are at valleys is preferred. In the present embodiment, to suppress consumption of electric power to hold memory, gate G is provided in the memory cell. This will be detailed in section (vi) Physical Structure of the Memory Cell which will be described later.

(iv) Reading of Information

In a reading operation, only the memory cell of a matrix of memory cells that is located at the intersection between the address signal lines Ax, Ay must be accessed, and when a signal is supplied only to the row address signal line Ax, or when a signal is supplied only to the column address signal lines Ay, the state shown in FIG. 7B must be established.

When signals are supplied to both row and column address signal lines, the state shown in FIG. 7C must be established.

Here, supplying a signal means changing the voltages of the address signal lines. In changing the voltages of the address signal lines, when thresholds are different between the positive and the negative sides, an offset which makes a middle voltage 0 is considered in the following description. In the description, a symmetrical relationship between positive and negative voltage thresholds will be considered.

Figure 9A:
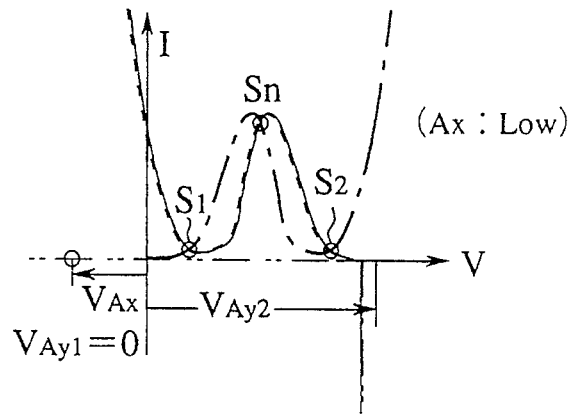
FIGS. 9A to 9C are diagrams of characteristic curves showing reading operation 1.
Figure 9B:
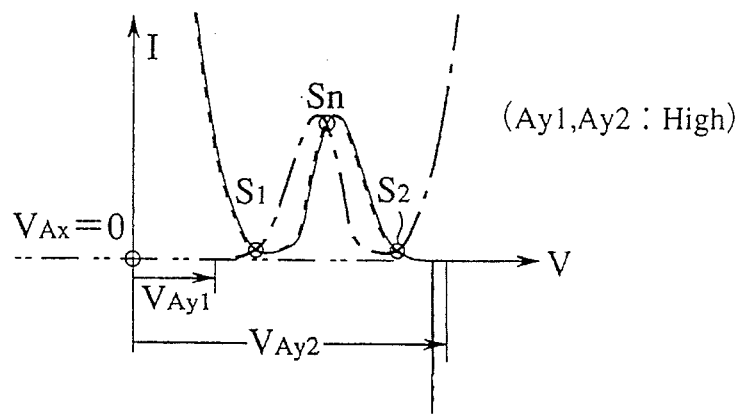
Figure 9C:
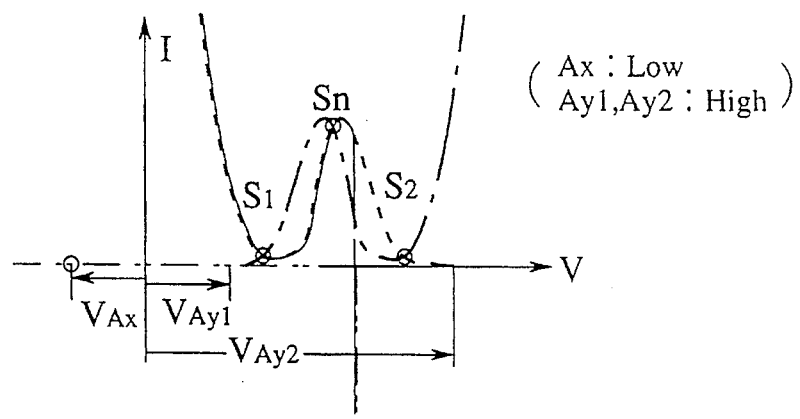

Accordingly, in reading when the memory cell is at stable operating point S2, a low-level voltage is supplied to the row address signal line Ax, and a high-level voltage is supplied to the column address signal lines AY1, AY2 so that Vsn<(VAx+Vth)<Vs2. When the low-level voltage is supplied to the row address signal line Ax, the voltage Vax+Vth is lowered. On the other hand, when the high-level voltage is supplied to the column address signal lines Ay1, Ay2, voltage Vs2 is raised. The level of the voltage supplied is so determined that when the row address signal line Ax is supplied with the low-level signal, or the column address signal lines Ay1, Ay2 are supplied with the high-level signal, the inequality (VAx+Vth)>Vs2 is maintained, i.e., the state shown in FIG. 7B is retained. When both these voltages are supplied to the associated address signal lines, then (VAx+Vth)<Vs2, i.e., the state shown in FIG. 7C is established, whereby a memory cell only at the intersection between the row address signal line Ax and the column address signal lines Ay (Ay1, Ay2) is read. FIG. 9A shows the state obtained when the low-level voltage is applied only to the row address signal line Ax. FIG. 9B shows the state obtained when the high-level voltage is supplied only to the column address signal lines Ay1, Ay2. FIG. 9C shows the state obtained when the high-level voltage is supplied to the row address signal line Ax and the low-level voltage is supplied to the column address signal lines Ay1, Ay2.

Figure 10A:
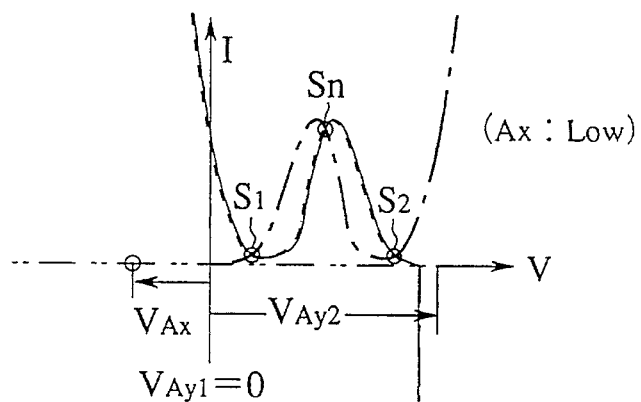
FIGS. 10A to 10C are diagrams of characteristic curves showing reading operation 2.
Figure 10B:
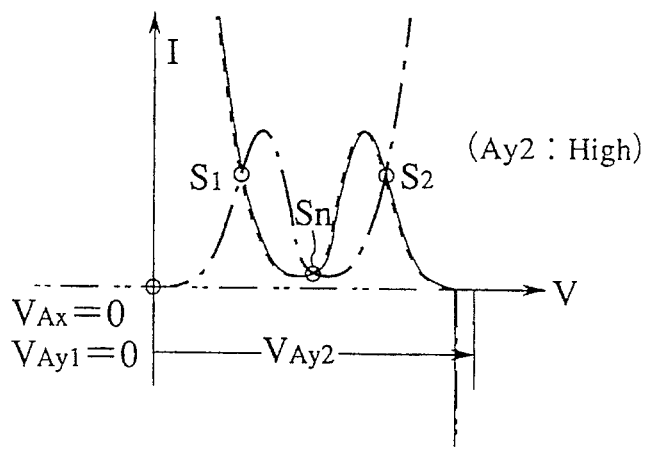
Figure 10C:
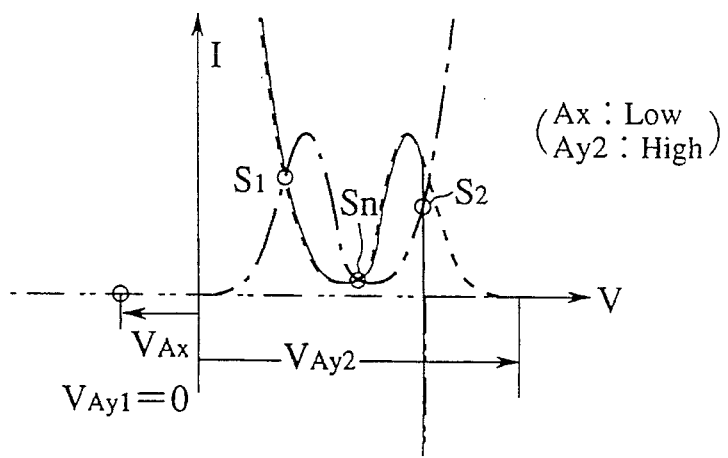

As shown in FIG. 10, voltages can be set so as to satisfy the above-described conditions by the combination of:

(1) Ax—at a low-level; and, (2) Ay2—at a high-level;

in place of the following combination:

(1) Ax—at a low-level; and, (2) Ay1, Ay2—at a high-level.

In the above description, the initial state of the reading operation is the same as the holding state. (This is because the holding state usually reduces electric power consumption the most; no different voltages have to be set, etc.). However, as long as the above conditions are established, the initial state is not essentially the same as the holding state. In the present invention, because the base-collector junction D3 has a threshold on the negative side, reading cannot be accomplished when the memory state is at the stable operating point S1.

(v) Writing of Information

In a writing operation, because only the memory cell of a matrix of memory cells that is located at the intersection between the row address signal line Ax and the column address signal lines Ay must be read, when a voltage is supplied only to the row address signal line Ax or the column address signal lines Ay, the states shown in FIGS. 7B and 7C, or the state shown in FIG. 8A must be established, and when voltages are supplied to both row and column address signal lines, the state shown in FIG. 7D or FIG. 8B must be established.

Here, supplying a signal means changing the voltage of an address signal line. In changing the voltages of address signal lines, when thresholds are different between the positive and the negative sides, an offset which makes a middle voltage 0 is considered in the following description. In the description, a symmetrical relationship between positive and negative voltage thresholds will be considered.

In a writing operation when the memory cell is at a stable operating point S1, a low-level voltage is supplied to the row address signal line Ax, and a high-level voltage is supplied to the column address signal lines Ay1, Ay2. When the low-level voltage is supplied to the row address signal line Ax, the sum voltage Ax+Vth is lowered. When the high-level voltage is supplied to the column address signal line Ay2, the voltage Vsn is raised. The level of the voltage supplied is so determined that when the row address signal line Ax is supplied with the low-level signal, or the column address signal lines Ay1, Ay2 are supplied with the high-level signal, the inequality (VAx+Vth)>Vs2 is maintained, i.e., the state shown in FIG. 7B or 7C is retained. When both these voltages are supplied to the associated address signal lines, then (VAx+Vth)<Vs2, i.e., the state shown in FIG. 7D is established, whereby one stable operating point is obtained only at the intersection between the row address signal line Ax and the column address signal lines Ay(Ay1, Ay2).

The stable operating point has the same nature as the stable operating point S1 because a voltage applied to the base-emitter junction layer D1 is lower than a peak voltage. When both row and column address signal lines are returned to their initial holding states, the stable operating points are reduced to the stable operating point S1, and writing when the memory cell is at the stable operating point S1 is enabled.

Figure 11A:
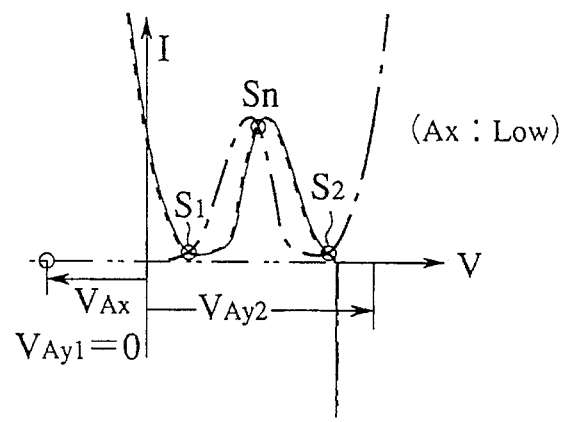
FIGS. 11A to 11C are diagrams of characteristic curves illustrating writing operation 1 of the memory cell in the state corresponding to a stable operating point S1.
Figure 11B:
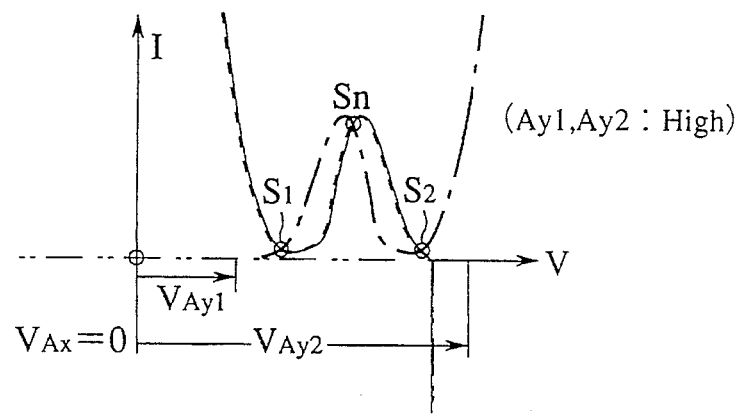
Figure 11C:
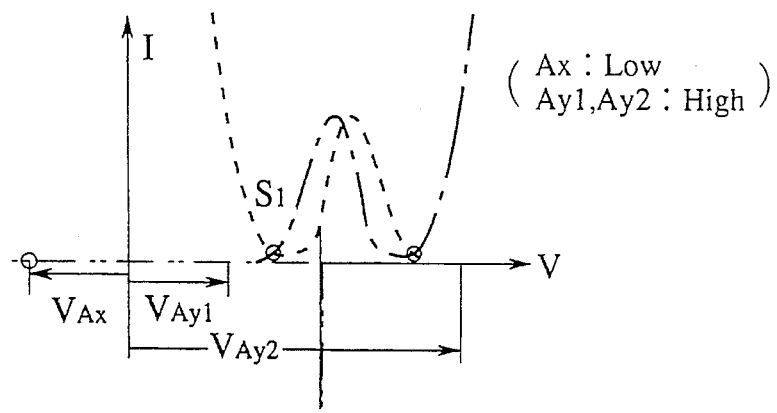

FIG. 11A shows the state obtained when the low-level voltage is supplied only to the row address signal line Ax. FIG. 11B shows the state obtained when the high-level voltage is supplied to both of the column address signal lines Ay1, Ay2. FIG. 11C shows the state obtained when the low-level voltage is supplied to the row address signal line Ax, and a high-level voltage is supplied to the column signal address signal lines Ay1, Ay2.

Figure 12A:
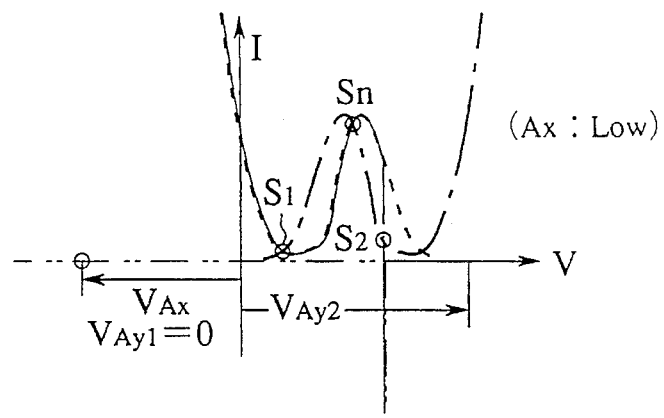
FIGS. 12A to 12C are diagrams of characteristic curves illustrating writing operation 2 of the memory cell in the state of the stable operating point S1.
Figure 12B:
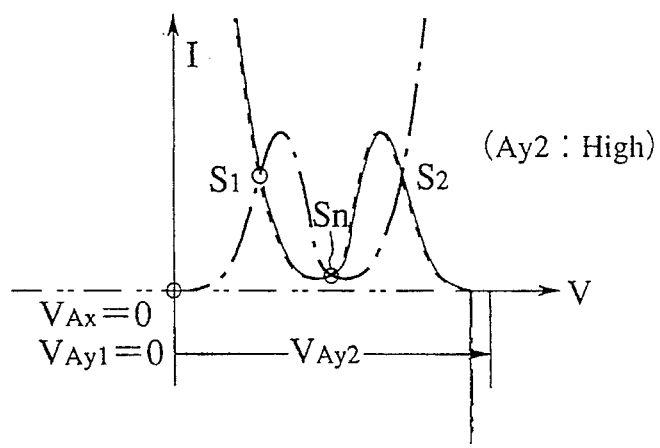
Figure 12C:
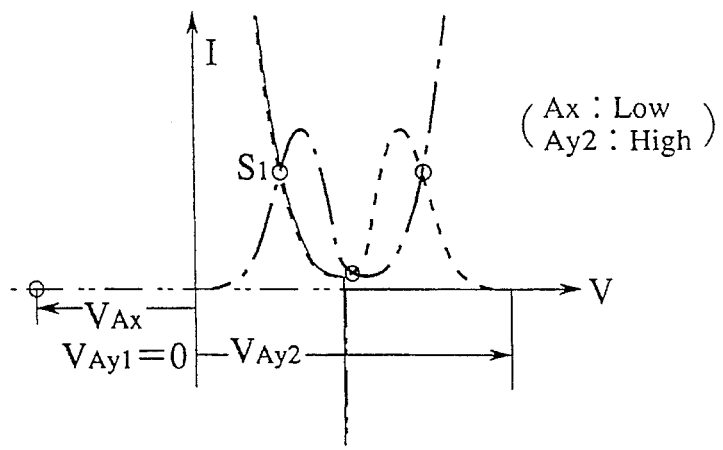

As shown in FIG. 12, the same conditions can be set by the combination of:

| | | |
|---|---|---|
| (1) Ax | low-level; and, | |
| (2) Ay2 | high-level; | | in place of the following combination:

| | | |
|---|---|---|
| (1) Ax | low-level; and, | |
| (2) Ay1, Ay2 | high-level. | |

Although not shown, depending on characteristics, the same conditions can be set by the combination of:

| | | |
|---|---|---|
| (1) Ax | low-level; and, | |
| (2) Ay1 | high-level. | |

In writing, when the memory cell is at the stable operating point S2, the high-level voltage is supplied to the row address signal line Ax, and the low-level voltage is supplied to the column address signal lines Ay1, Ay2.

The high-level voltage for the row address signal line Ax and a low-level voltage for the column address signal lines Ay1, Ay2 are determined in the following manner.

First, when only the row address signal line Ax is supplied with a high-level voltage; or, when only the column address signal lines Ay1, Ay2 are supplied with a low-level voltage; then VAx<(VAy1+Vr), i.e., the state shown in FIG. 7B; or much gain cannot be obtain even with VAx>(VAy1+Vr) (many of electrons injected at the emitter E1 do not arrive at the collector) and two stable operating points are present, i.e., the state shown in FIG. 8A will be attained.

Second, when the row address signal line Ax is supplied with a high-level voltage; and, the column address signal lines Ay1, Ay2 are supplied with a low-level voltage; then VAx>(VAy1+Vr) is established, much gain can be obtained and one stable operating point is present, i.e., the state shown in FIG. 8B will be attained.

In both situations above, writing is enabled when the memory cell is at stable operating point S2 only where the row address signal line Ax intersects the column address signal lines Ay1, Ay2.

Figure 13A:
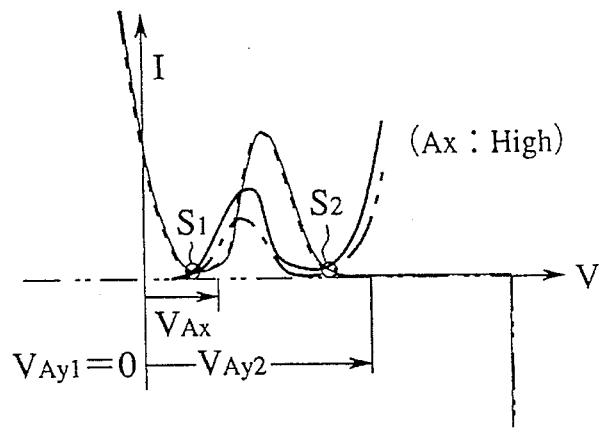
FIGS. 13A to 13C are diagrams of characteristic curves illustrating writing operation 1 of the memory cell in the state corresponding to a stable operating point S2.
Figure 13B:
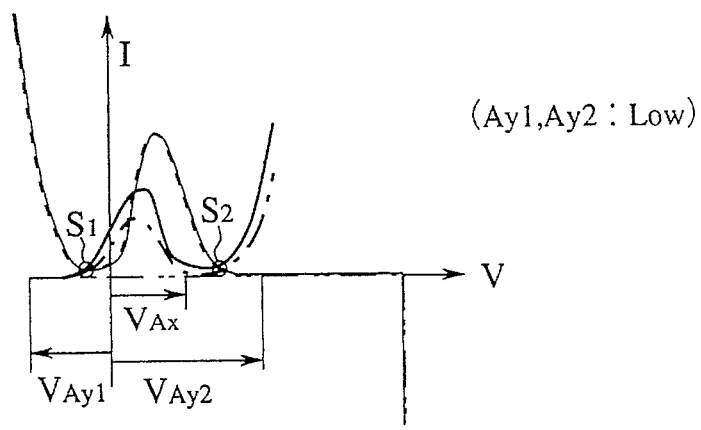
Figure 13C:
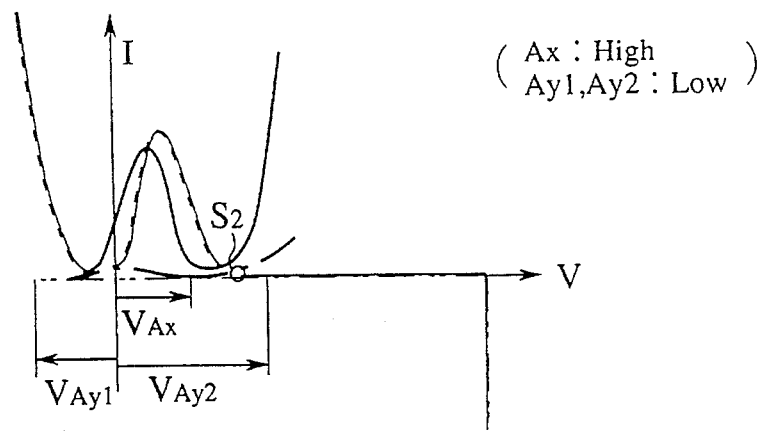

FIG. 13A shows the state obtained when the high-level voltage is supplied only to the row address signal line Ax. FIG. 13B shows the state obtained when the low-level voltage is supplied to the address signal lines Ay1, Ay2. FIG. 13C shows the state obtained when the high-level voltage is supplied to the row address signal line Ax and the low-level signal is supplied to the column address signal lines Ay1, Ay2.

Figure 14A:
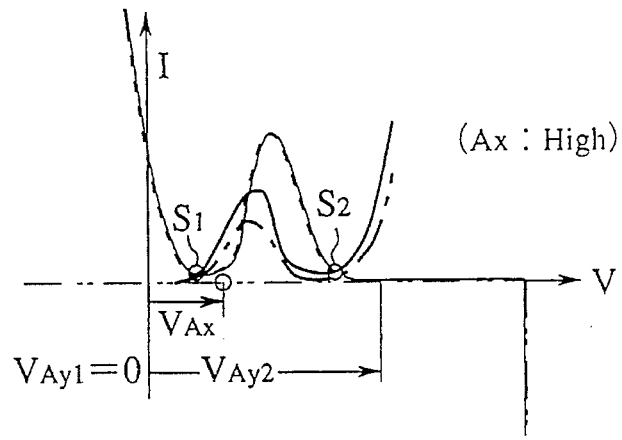
FIGS. 14A to 14C are diagrams of characteristic curves illustrating writing operation 2 of the memory cell in the state corresponding to the stable operating point S2.
Figure 14B:
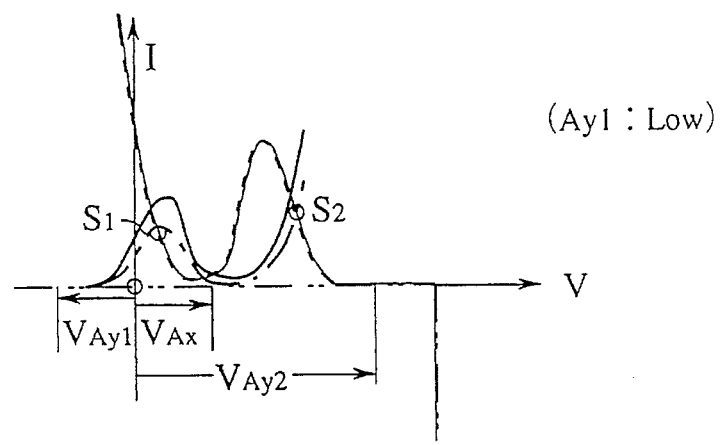
Figure 14C:
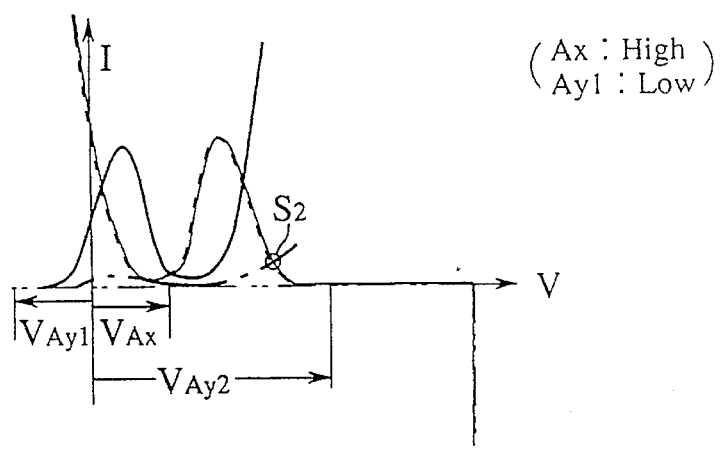

As shown in FIG. 14, voltages can be set so that the conditions shown in FIG. 13C can be satisfied by the combination of:

| | | |
|---|---|---|
| (1) Ax | high-level; and, | |
| (2) Ay1 | low-level | | in place of the combination:

| | | |
|---|---|---|
| (1) Ax | high-level; and, | |
| (2) Ay1, Ay2 | low-level. | |

Although not shown, depending on characteristics, voltages can be so set that the above conditions can be satisfied by the combination of:

| | | |
|---|---|---|
| (1) Ax | high-level; and, | |
| (2) Ay2 | low-level; or, | |
| (1) Ax | high-level; and, | |
| (2) Ay1 | high-level. | |

In the above description, the initial state of the reading operation is the same as the holding state. This is because the holding state usually reduces electric power consumption the most; no different voltages have to be set; etc. But as long as the above conditions are established, the initial state is not essentially the same as the holding state. Information may be written in respective memory cells when they are in a state corresponding to the stable operating points S1, S2 by the above-described method, or information may be written first in all memory cells when they are in a state corresponding to the stable operating point S2 or S1.

(vi) Physical Structure of the Memory Cell

Figure 15:
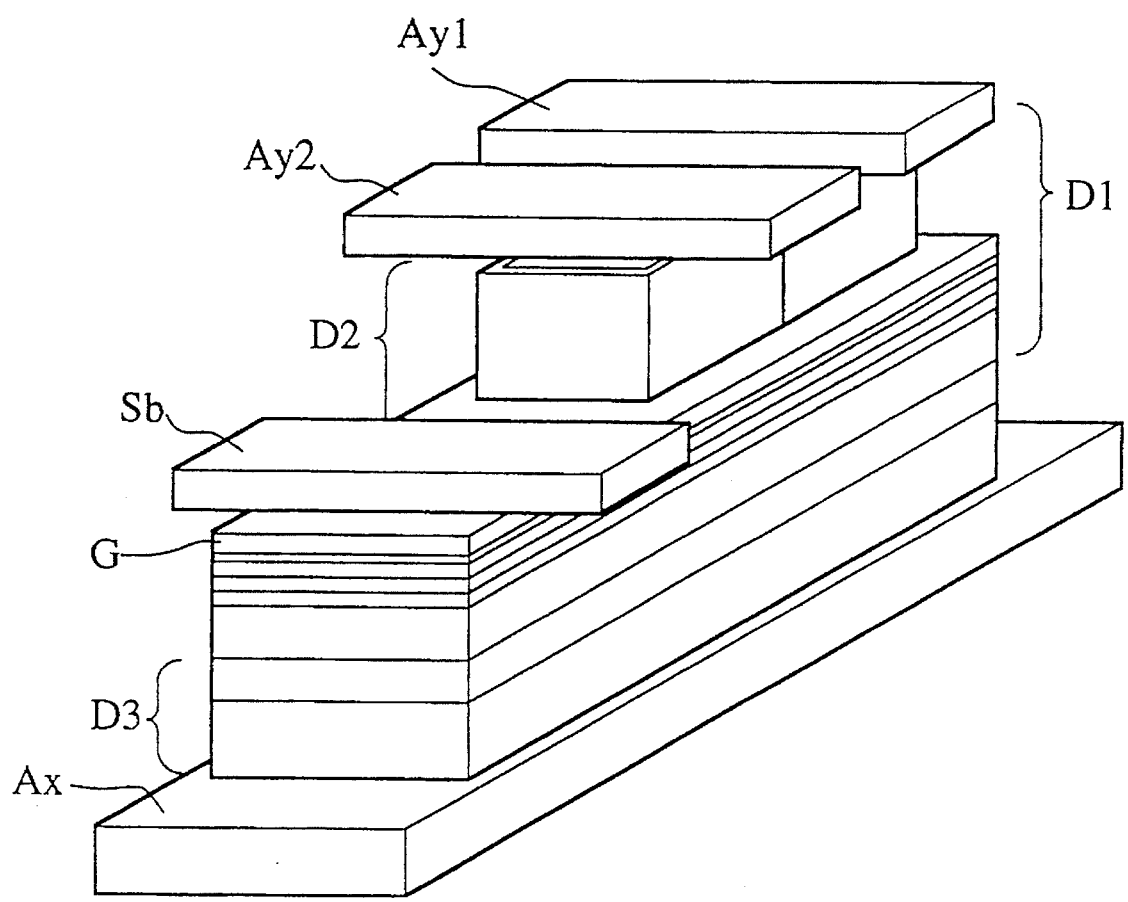
FIG. 15 is a perspective view of a solid structure of the memory cell (RHET).

FIG. 15 shows the solid structure of the memory cell. As shown in FIG. 15 the following elements are provided: the row address signal line layer Ax;

(1) the column address signal line layers Ay1, Ay2, comprising a pair of two parallel signal line layers arranged intersecting the row address signal line layer Ax;

(2) a standby signal line layer Sb; arranged in parallel with the column address signal line layers Ay1, Ay2; and, (3) a memory cell layer, formed at the intersections between the row address signal Ax and the column address signal wiring layers Ay1, Ay2.

In the memory cell layer, the base-collector junction layer D3, through which flows a current at a set threshold voltage Vth to the side of the row address signal line layer Ax, is formed between the address signal line layers Ax and Ay1, Ay2 with one side of the layer D3 electrically connected to the row address signal line layer Ax. The base-emitter junction layer D1 is formed in electric contact between the other side of the base-collector junction layer D3 and Ay1, one of the column address signal line layers Ay1, Ay2. The base-emitter junction layer D2 is formed in electric contact between the other side of the base-collector junction layer D3 and Ay2, the other layer of the column address signal line layers Ay1, Ay2. These respective layers are formed in a laminar structure. The gate layer G is formed around the base-emitter junction layers D1, D2. The depletion layer extends from and back to the gate layer G with a set applied voltage to control the current flowing to the base-emitter junction layers D1, D2. The gate layer G is in electric contact with the standby signal line layer Sb.

FIG. 16A shows a sectional structure of a semiconductor layer 100 of the memory cell of the RHET. FIG. 16B shows its energy band structure.

As shown, a good conductor layer ($n^{++}$GaAs) 12; a conductor layer ($n^+$GaAs) 13; a single barrier layer (iAlGaAs) 14; a conductor (n+GaAs) 15; a resonant tunnel barrier layer (iAlAs/iGaAs/iAlAs) 16; a conductor layer ($n^+$GaAs) 20; and, a good conductor layer ($n^{++}$GaAs) 21 are formed on a semi-insulating or insulating substrate (S.I.GaAs) 11 in the stated order in a laminar structure. The resonant tunnel barrier layer 16 comprises tunnel barrier layers (iAlAs) 17, 19, and a quantum well layer (iGaAs) 18.

The conductor layer ($n^+$GaAs) 15 and the single barrier layer (iAlGaAs) 14 are laid on each other in the base-collector junction layer D3.

The base-emitter junction layers D1, D2 are formed by the resonant tunnel structure comprising: the resonant tunnel barrier layer (iAlAs/iGaAs/iAlAs) 16; the conductor layer ($n^+$GaAs) 15; the conductor layer ($n^+$GaAs) 20; and, the good conductor layer ($n^{++}$GaAs) 21. Note that the resonant tunnel barrier layer 16 is sandwiched between layers 15 and 20.

As described above, the base-emitter junction layers D1, D2 have the resonant tunnel structure, and as shown in FIG. 15, the gate electrode G, connected to the standby signal line layer Sb, is formed above the resonant tunnel barrier layer (iAlAs/iGaAs/iAlAs) 16 around the base-emitter junction layers D1, D2. When a negative voltage is applied to the gate electrode G, the depletion layer from the gate electrode G is extended to decrease the effective area of the resonant tunnel barrier. Current flowing through the base-emitter junction layers D1, D2 is accordingly decreased.

Conversely, when a positive voltage is applied to the gate electrode G, the depletion layer from the gate electrode G is shrunk to increase the effective area of the resonant tunnel barrier. Current flowing through the base-emitter junction layers D1, D2 is increased. In the case where the gate electrode G is not formed, a depletion layer is constituted by a surface level formed on the surface of the conductor layer ($n^+$GaAs) 20 to decrease, to some extent, the effective area of the resonant tunnel barrier. This shrinks the depletion layer advantageously to increase the effective area of the resonant tunnel barrier even when the gate electrode G does not have a positive, but rather a 0 voltage.

As a result, in standby, as shown in FIG. 3B, a negative voltage is applied to the gate electrode G to decrease the base current, whereby electric power consumption is reduced. In reading and writing operations, as shown in FIG. 3A, a positive or a 0 voltage is applied to the gate electrode G to increase the base current, whereby the speed of information reading and writing can be increased.

Figure 16:
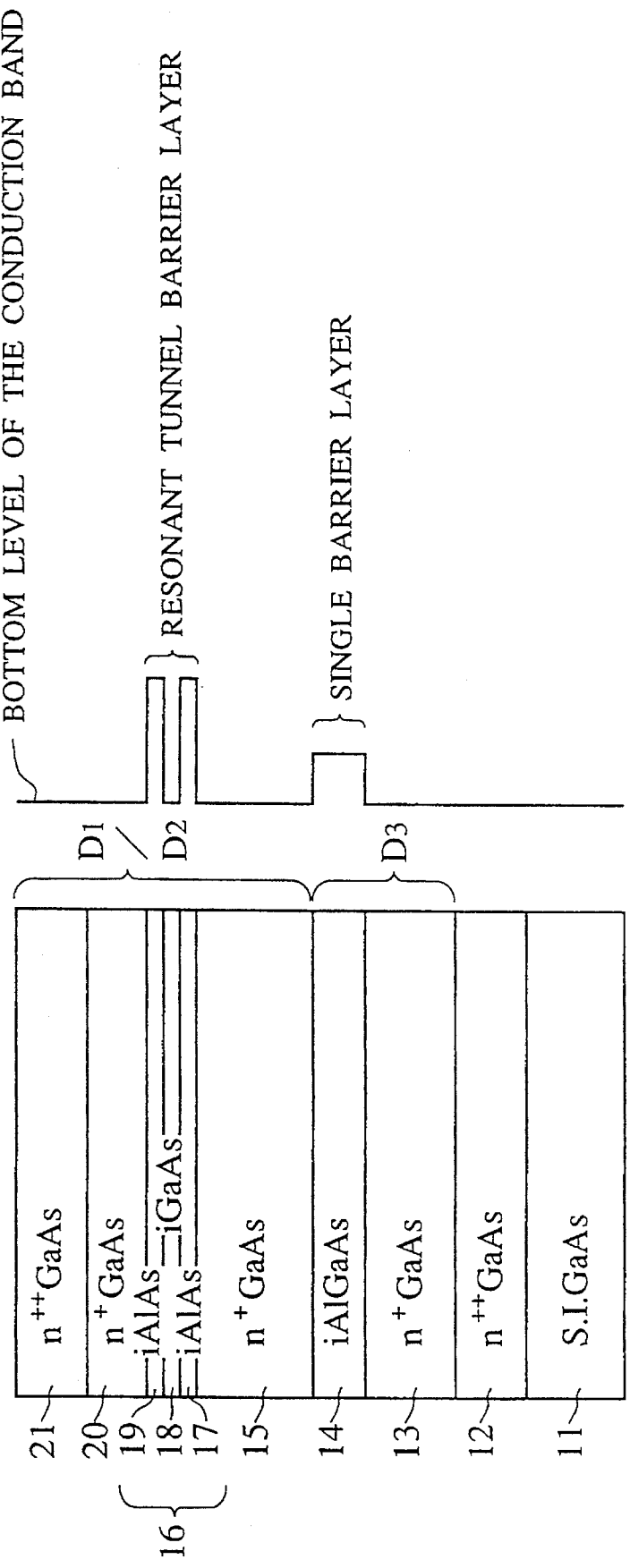
FIG. 16A is a sectional view of the memory cell of FIG. 1.
FIG. 16B is a view illustrating an energy band structure of the memory cell of FIG.1.
Figure 17:
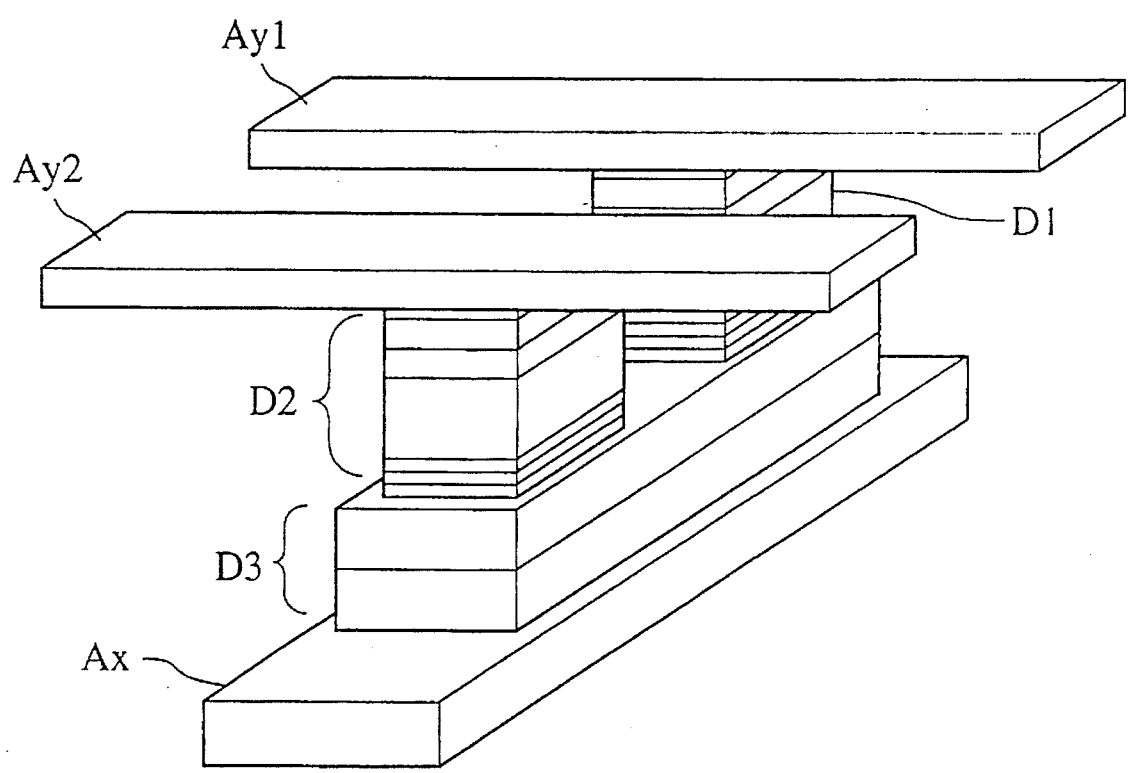
FIG. 17 is a perspective view of a solid structure of the memory cell (RBT).
Figure 18B:
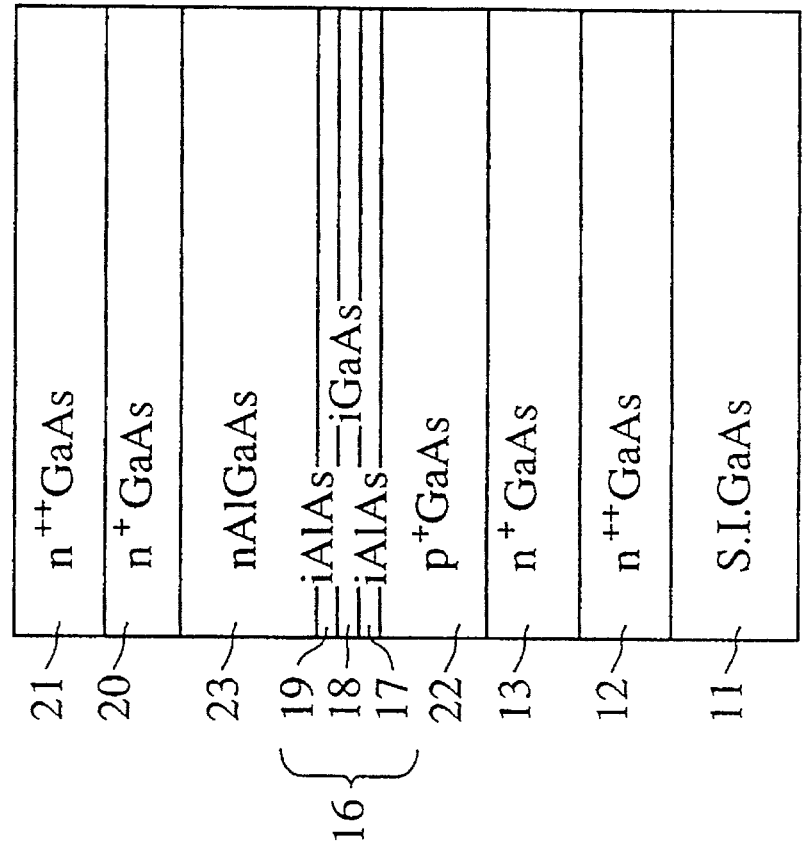
FIG. 18B is a view illustrating an energy band structure of the memory cell of FIG.17.
Figure 18A:
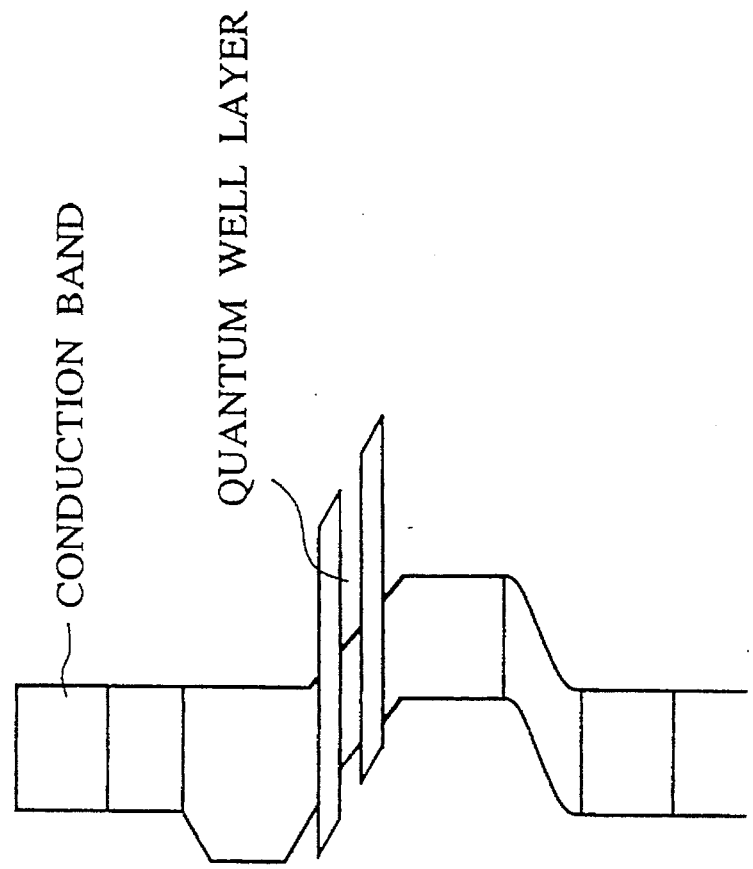
FIG. 18A is a sectional view of the memory cell of FIG. 17.

The memory cell shown in FIGS. 16A and 16B comprises an RHET, but may comprise an RBT in place of the RHET. As shown in FIGS. 17, 18A and 18B, the memory cell has substantially the same solid structure as in FIG. 16, but the semiconductor layer of the RBT comprises: an $n^{++}$GaAs layer 12; an $n^+$GaAs layer 13; a $p^+$GaAs layer 22; a resonant tunnel barrier layer (iAlAs/iGaAs/iAlAs) 16; an nAlGaAs layer 23; an $n^+$GaAs layer 20; and an $n^{++}$GaAs layer 21 formed on a semi-insulating or insulating substrate (S.I.GaAs) 11 in a laminar structure in the stated order (FIG. 18A). The resonant tunnel barrier layer has a resonant tunnel structure comprising a quantum well layer (iGaAs) 18, and tunnel barrier layer (iAlAs) 17, 19 sandwiching the quantum well layer.

[II] Row Address Signal Line Driver

As described in [I], to write the memory cell, a middle level voltage (Mid), a high-level voltage (High) and a low-level voltage (Low), in total three levels of voltage are necessary.

In the case where a row address decoder and the memory cell are directly connected to the row address signal line Ax, when writing is made in the stable operating point S1, a negative voltage is applied to the collector C of the transistor Tr of the memory cell, and the only current flowing upon writing is the leak current through the collector barrier. Likewise, when writing is conducted in the stable operating point S2, a positive voltage is applied to the collector C of the transistor Tr of the memory cell, and the transistor Tr is put into operation. The writing current becomes: (current injected at the emitter)×(gain of the transistor Tr)+(the leak current through the collector barrier). This makes design of the memory cell difficult.

In view of this, to solve the problem, a row address signal line driver is proposed here. Such an address signal line driver will be explained below.

[Embodiment 1]

Figure 19:
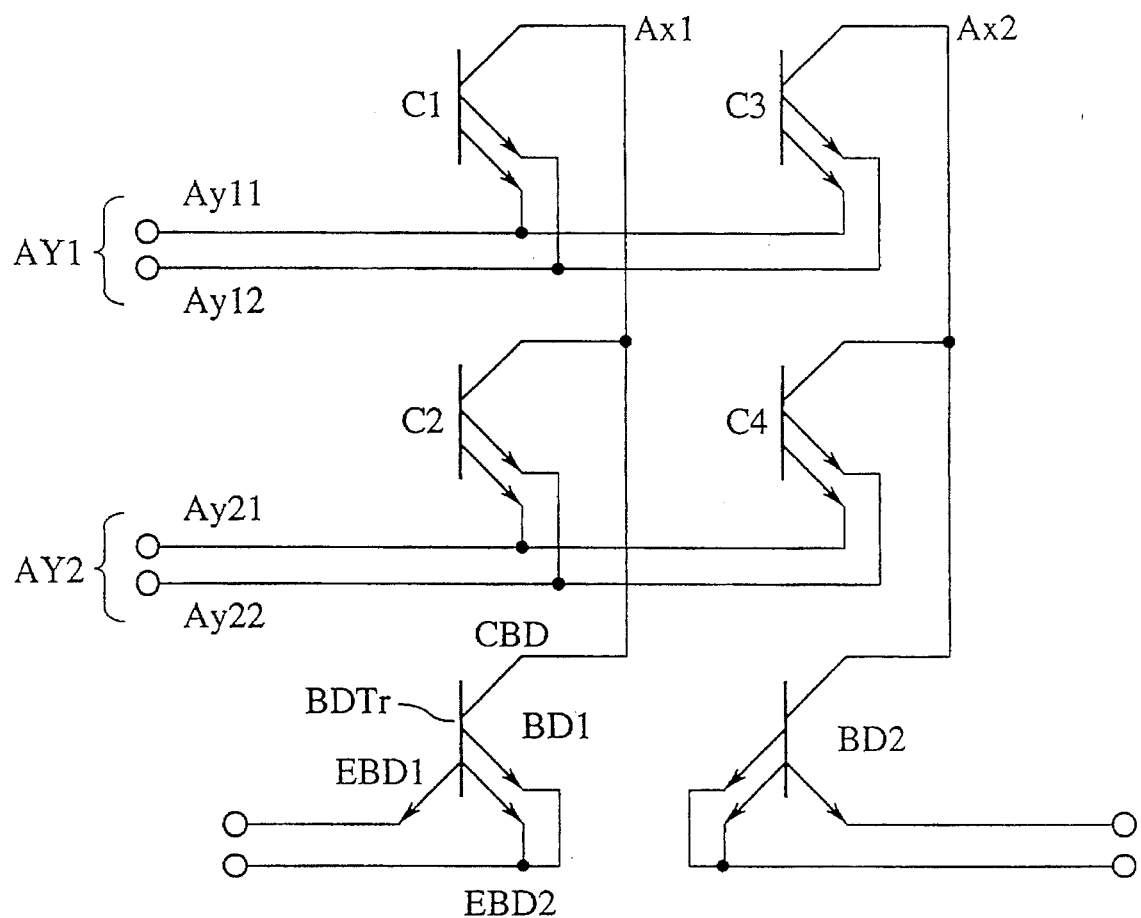
FIG. 19 is an equivalent circuit diagram of the memory cell with the row address signal line driver added.

FIG. 19 shows a circuit equivalent to the memory cells and row address signal line drivers BD. FIGS. 20A to 26D show energy band structures of the circuit in its stable operating states.

FIG. 19 shows a memory array of 2 rows and 2 columns, and the row address signal line driver BD connected thereto.

As shown in this figure, the row address signal lines AX1, AX2 are arranged in the direction of rows, and two pairs of two column address signal lines AY1, AY2 are arranged in columns intersecting the row address signal lines Ax1, Ax2 electrically unconnected therewith. Memory cells C1, C2, C3, C4 each comprising one transistor are formed at the respective intersections. Row address signal line drivers BD1, BD2 are provided at one end of the respective row address signal lines AX.

The row address signal line drivers BD1 and BD2 will be explained below using for example the case of the row address signal line driver BD1 connected to the row address signal line AX1.

The row address signal line driver BD1 comprises one transistor BDTr including one collector electrode CBD and two emitter electrodes EBD1, EBD2. The row address signal line AX1 is connected to the collector CBD of the transistor BDTr, so that row address signals from a row address decoder 1 are received by the two emitters EBD1, EBD2.

The transistors BDTr constituting the row address signal line drivers BD basically have the same structure as the double emitter transistors constituting the memory cells and may be double emitter-type RHETs (as shown in FIG. 15) or double emitter-type RBTs (as shown in FIG. 17) with the emitter pn junctions having a low backward breakdown voltage. Lowering the backward breakdown voltage of the emitter pn junction is to obtain the emitter current even when the emitter pn junction is biased with backward voltage.

A difference between the transistors of the row address signal line drivers from those of the memory cells are that the two emitter electrodes have different areas from each other and include the emitter EBD1 with a smaller area and emitter EBD2 with a larger area. In FIG. 19 the emitters EBD2 with the larger area are indicated by two arrows.

Figure 20A:
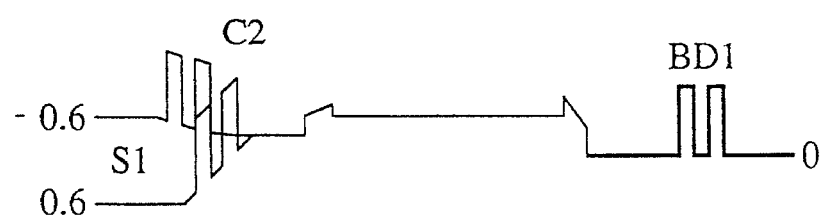
FIGS. 20A and 20B are views illustrating energy band structures of the memory cell and the row address signal line driver in the holding state.
Figure 20B:
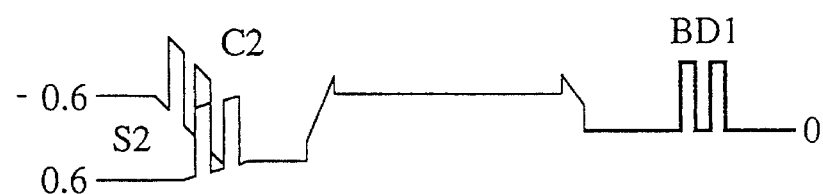
Figure 21A:
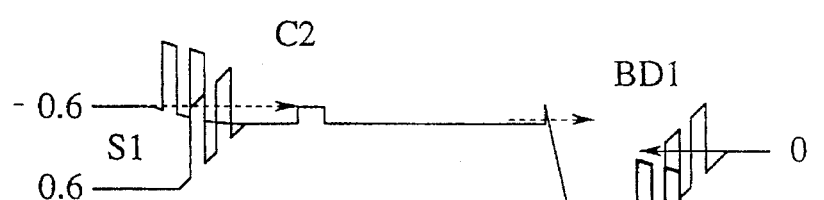
FIGS. 21A and 21B are views illustrating energy band structures of the memory cell and the row address signal line driver obtained when the row address signal line is selectively at a high-level voltage.
Figure 21B:
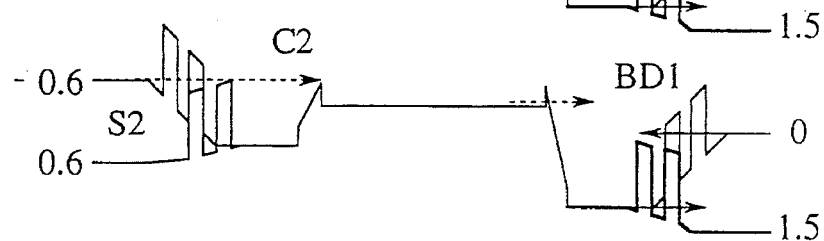
Figure 22A:
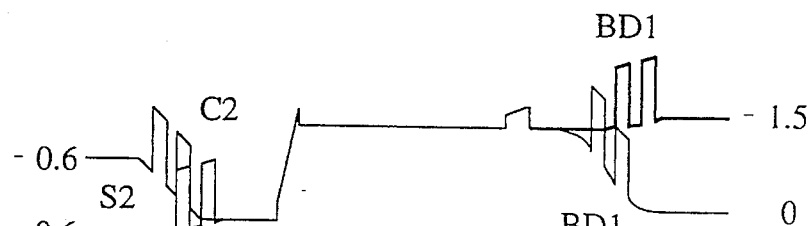
FIGS. 22A and 22B are views illustrating energy band structures of the memory cell and the row address signal line driver obtained when the row address signal line is selectively at a low-level voltage.
Figure 22B:

The energy band structure for the holding state is shown in FIG. 20. FIG. 20A shows the energy band structure of the state when the memory cell C2 is at the stable operating point S1. FIG. 20B shows the energy band structure of the state when the memory cell C2 is at the stable operating point S2. In the holding state a row address signal of 0 V, for example, is applied to the respective two emitters EBD1, EBD2 of the row address signal line driver BD1. A signal of −0.6 V, for example, is applied to the column address signal line Ay11, and 0.6 V, for example, is applied to the column address signal line Ay12.

To select the row address signal line AX1, a voltage at a higher level (e.g., by −1.5 V) than the holding state, or a low-level voltage (e.g., by 1.5 V) is applied to the larger-area emitter EBD2 of the row address signal line driver BD1, and 0 V, for example, is applied to the smaller-area emitter EBD1.

A voltage to be applied to the larger-area emitter EBD2 must be at a high-level when writing is conducted in the memory cell C2 at the stable operating point S2, and must be at a low-level when writing is conducted in the memory cell C2 at the stable operating point S1.

When a high-level voltage is applied to the larger-area emitter EBD2 (FIG. 21), the base voltage of the row address signal line driver EBD1 rises, but the base voltage of the memory cell does not change. Accordingly, a potential difference between the base potential of the memory cell C2 and the base potential of the row address signal line driver EBD 1 is not large enough to rewrite a state of the memory cell C2, and the state of the memory cell C2 is not changed.

When a low-level voltage is applied to the larger-area emitter EBD2 (FIG. 22), the base voltage of the row address signal line driver BD1 is lowered, but the base voltage of the memory cell C2 is not changed. Accordingly, a potential difference between the base potential of the memory cell C2 and the base potential of the row address signal line driver BD1 is not large enough to rewrite the state of the memory cell C2, and the state of the memory cell C2 is not changed.

To select the column address signal line AY2, a voltage higher or lower by, e.g., 0.9 V than the holding state voltage is applied to the row address signal line AY2.

A voltage to be applied to the row address signal line AY2 must be at a low-level when writing is conducted in the memory cell C2 when it is at the stable operating point S2, and must be at a high-level when writing is conducted in the memory cell C2 when it is at the stable operating point S1.

When a low-level voltage is applied to the respective row address signal lines Ay21, Ay22 (FIG. 23), a base voltage of the memory cell C2 is lowered, but a base voltage of the row address signal line driver BD1 is not changed. Accordingly, a potential difference between the base potential of the memory cell C2 and a base potential of the row address signal line driver BD1 is not large enough to rewrite a state of the memory cell, and the state of the memory cell C2 is not changed. States of the rest of memory cell C4 connected to the same column address signal line do not change.

When a high-level voltage is applied to the respective column address signal lines Ay21, Ay22 (FIG. 24), a base voltage of the memory cell C2 rises, but a base voltage of the row address signal line driver is not changed. In this case as well, the potential difference between a potential of the column address signal line driver BD1 is not large enough to rewrite a state of the memory cell C2. The state of memory cell 2 is not changed. States of the rest of memory cell C4 connected to the same column address signal line do not change.

Thus, all of the memory cells are not selected by selecting any one of the row address signal lines AX or any one of the column address signal lines AY.

Now, a method for rewriting the memory cell C2 by applying, in addition to a row address signal, a column address signal to the column address signal lines Ay21, Ay 22 will be explained.

[Writing at Stable Operating Point S2]

When the memory cell C2 of the column address signal line AY2 is selected by a column address signal, a low- or high-level voltage is applied to the column address signal line AY2, depending on which of the stable operating points S1, S2 writing is conducted in. When writing is conducted in the stable operating point S2, a voltage lower by, e.g., 0.9 V, than the holding state is applied to the respective column address signal lines Ay21, Ay22.

To select the row address signal line AX1, a high-level voltage is applied to the larger-area emitter EBD2 of the row address signal line driver BD1. Then, to select the column address signal line AY2, a low-level voltage is applied to the respective column address signal lines Ay21, Ay22. When the memory cell C2 is rewritten from the state of stable operating point S1 to that of stable operating point S2, memory cell C1 may originally be at stable operating point S1 or S2. By addressing with the above-described procedure, these states are changed to the state of FIG. 25A and that of FIG. 25B.

Figure 25A:
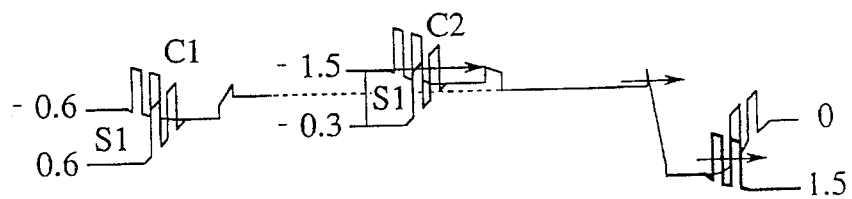
FIGS. 25A to 25D are views illustrating energy band structure changes obtained when the memory cell is written in the state corresponding to the stable operating point S2.
Figure 25B:
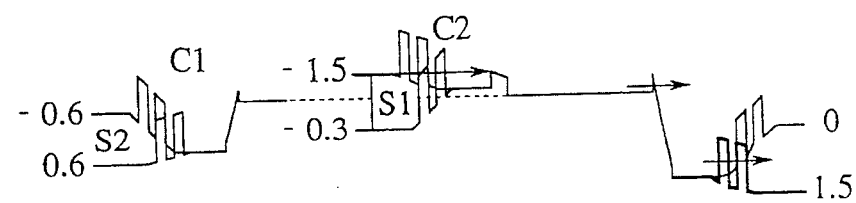
Figure 25C:
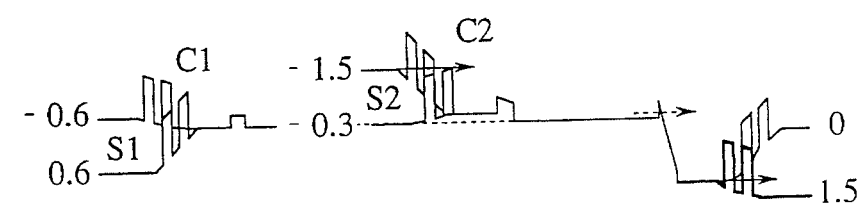
Figure 25D:
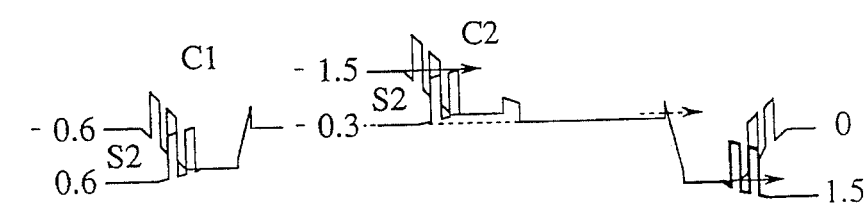

In the state of FIG. 25A or FIG. 25B, a large potential difference occurs between the base potential of the memory cell C2 and the base potential of the row address signal line driver BD1. The collector barrier of the row address signal line driver BD1 is sufficiently reverse biased for the transistor BDTr of the row address signal line driver BD1 to operate and gain. As a result, electrons flow into the base of the row address signal line driver BD1, and the base potential of the memory cell C2 rises sufficiently to shift to stable operating point S2. Thus, the shift of writing from the state of stable operating point S1 to that of stable operating point S2 is completed (FIGS. 25C and 25D).

[Writing at Stable Operating Point S1]

When writing is conducted when the memory cell is at stable operating point S1, a voltage higher by, e.g., 0.9 V than the holding state is applied to the respective column address signal lines Ay21, Ay22 (FIGS. 26A to 26D).

First, to select the row address signal line Ax1, a low-level voltage is applied to the larger-area emitter EBD2 of the row address signal line driver BD1. Then, to select the column address signal line AY2, a high-level voltage is applied to the respective column address signal lines Ay21, Ay22. When the memory cell C2 is rewritten from the stable operating point S2 to the stable operating point S1, memory cell C1 may originally be at stable operating point S1 or S2. By addressing with the above procedure, these states are changed to those of FIGS. 26A and 26B.

Figure 26A:
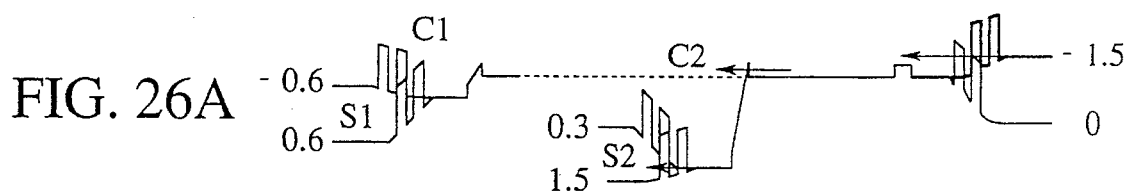
FIGS. 26A to 26D are views illustrating energy band structure changes obtained when the memory cell is written in the state corresponding to the stable operating point S1.
Figure 26B:
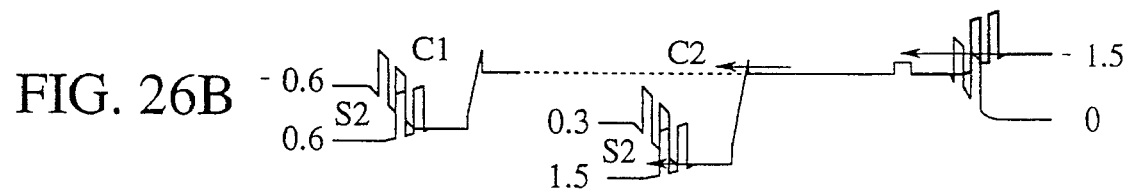
Figure 26C:
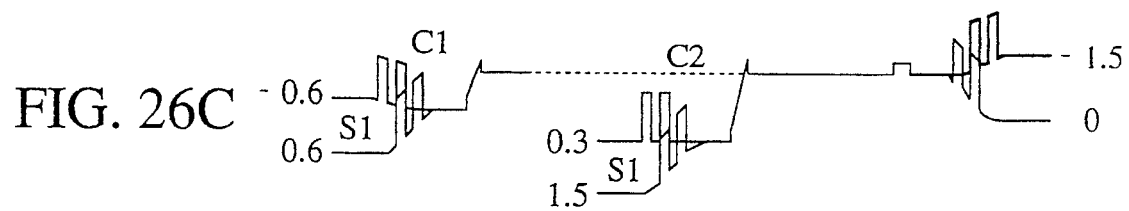
Figure 26D:
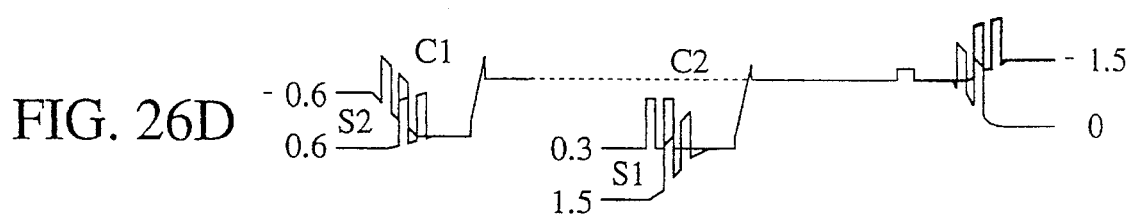

In the state of FIG. 26A or FIG. 26B, a large potential difference occurs between the base potential of the memory cell C2 and the base potential of the row address signal line driver BD1. Accordingly, the collector barrier of the memory cell C2 is sufficiently reverse biased for the transistor Tr of the memory cell C2 to operate and gain. As a result, electrons flow into the base of the memory cell C2, and the base potential of the memory cell C2 is lowered sufficiently to shift to stable operating point S1. Thus, the shift of writing from the state of stable operating point S2 to that of stable operating point S1 is completed (FIGS. 26C and 26D).

Writing in the memory cell C2 is conducted by the above-described procedure. Preferably a voltage to be applied to the larger-area emitter EBD2 of the row address signal line driver BD1 is set as follows, with respect to the smaller-area emitter EBD1. That is, when the memory cell is held at stable operating point S1 or S2, the voltage is set so that the transistor BDTr of the row address signal line driver BD1 is not operative; when writing is conducted at stable operating point S2, the voltage is lowered to a voltage at which the two emitters of the row address signal line driver BD1 have a bistable state; and when writing is conducted at stable operating point S1, the voltage is raised to a voltage at which the two emitters of the row address signal line BD1 have a bistable state.

Figure 27A:
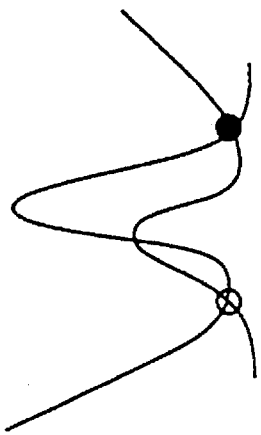
FIGS. 27A to 27C are diagrams of load curves explaining the row address signal line driver.
Figure 27B:
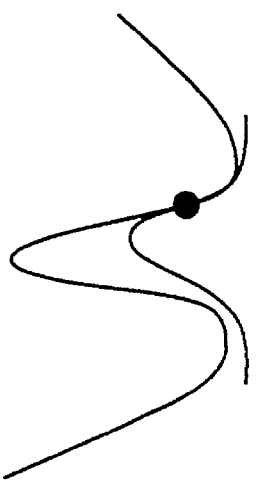
Figure 27C:
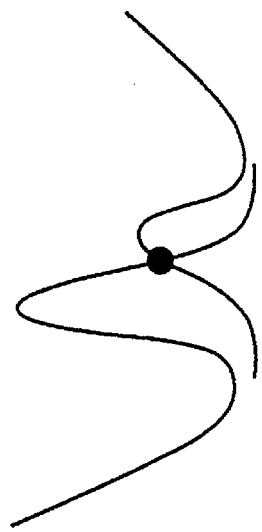

In this case, it is effective to set the base potential of the row address signal line driver BD such that the two emitter electrodes of the row address signal line driver BD have different areas from each other. That is, when a row address signal is supplied between the emitters EBD1, EBD2, because of different areas of the emitters EBD1, EBD2, a voltage applied between the base and the emitter EBD1, with lower current driving capacity, is higher than that applied between the base and the emitter EBD2 with higher current driving capacity (FIGS. 27A and 27B). Accordingly, a voltage is applied between the two emitters until the two emitters have a bistable state (FIG. 27C), a high voltage corresponding to a valley voltage is applied between the emitter EBD1 and the base, and conversely substantially no voltage is applied between the emitter EBD2 and the base.

Making areas of the emitters thus different from each other can generate a large difference in base potentials, and, in addition, make it possible to uniquely determine the base voltage. In the case where the emitters are not different from each other in area, the state that is generated—from two bistable states—is not controllable, and the base voltage cannot be uniquely determined.

In the present embodiment, the row address signal line driver BD is provided by a transistor of the same structure as the transistor Tr of the memory cell. This enables two collector barriers to be connected symmetrical with respect to the row address signal line Ax between the base of the memory cell C and the base of the transistor BDTr of the row address signal driver BD. In this state, when a potential difference is present between their bases, either of the collector barriers is biased forward, and the other collector barrier is reversely biased. Accordingly, whether a positive or negative voltage is applied to the emitter EBD2 of the row address signal line driver, the circuits can be substantially equivalent to each other, whereby the holding state can be set at 0 potential, and a voltage to be applied in writing when in the state of stable operating point S1 or stable operating point S2 can have equal positive and negative values. This facilitates design of the circuits.

[Embodiment 2]

Figure 28:
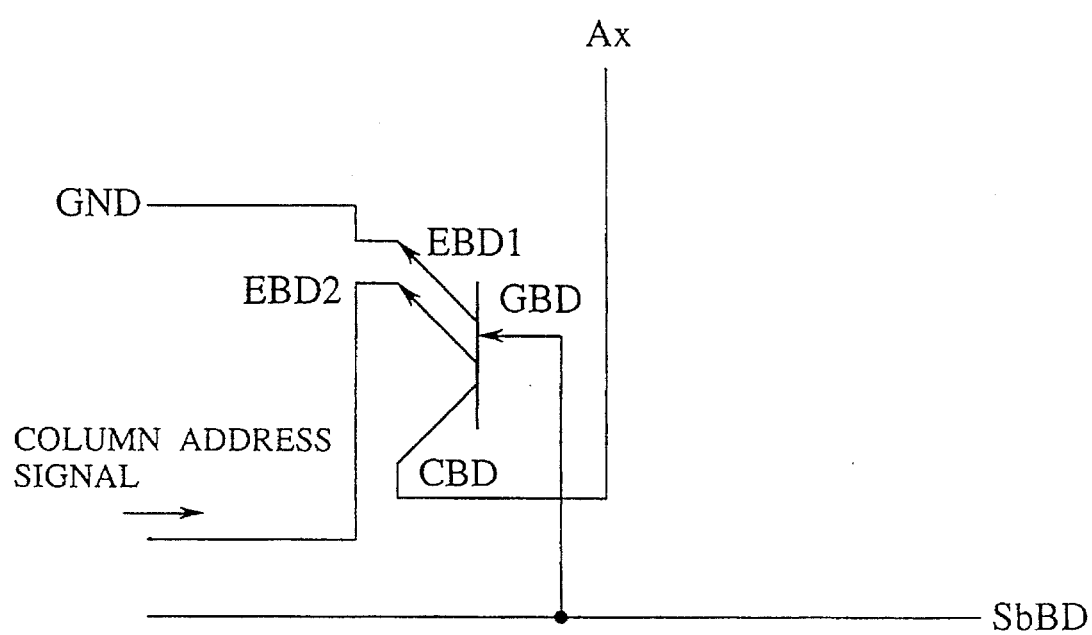
FIG. 28 is an equivalent circuit diagram of the row address signal line driver with the gate control signal line added.

FIG. 28 shows an example of a gate that is provided in the transistor of each row address signal line driver BD.

The row address signal line driver BD shown in FIG. 28 comprises a transistor BDTr of the double emitter structure including one collector electrode CBD and two emitter electrodes EBD1, EBD2, and a gate GBD which is provided in one EBD1 of the emitter electrodes and changes an effective area of the emitter electrode EBD1 by a voltage applied thereto.

The emitter electrode EBD1 provided in the gate GBD of the transistor BDTr is grounded (GND), the collector electrode CBD of the transistor BDTr is connected to the row address signal line Ax, and the gate GBD is connected to a gate control signal line SbBD.

In the embodiment of FIG. 19, a base potential is determined by the use of two emitter electrodes of different areas, but in the present embodiment of FIG. 28, extension of the depletion layer is controlled by a signal supplied to the gate control signal line SbBD to change the effective emitter area.

That is, in writing, a negative voltage is pre-applied to the gate GBD, whereby the transistor can then have one emitter whose area is effectively smaller. Accordingly, the method for writing is quite the same as the first embodiment shown in FIG. 19 except that a negative voltage is pre-applied to the gate GBD.

[Embodiment 3]

Figure 29:
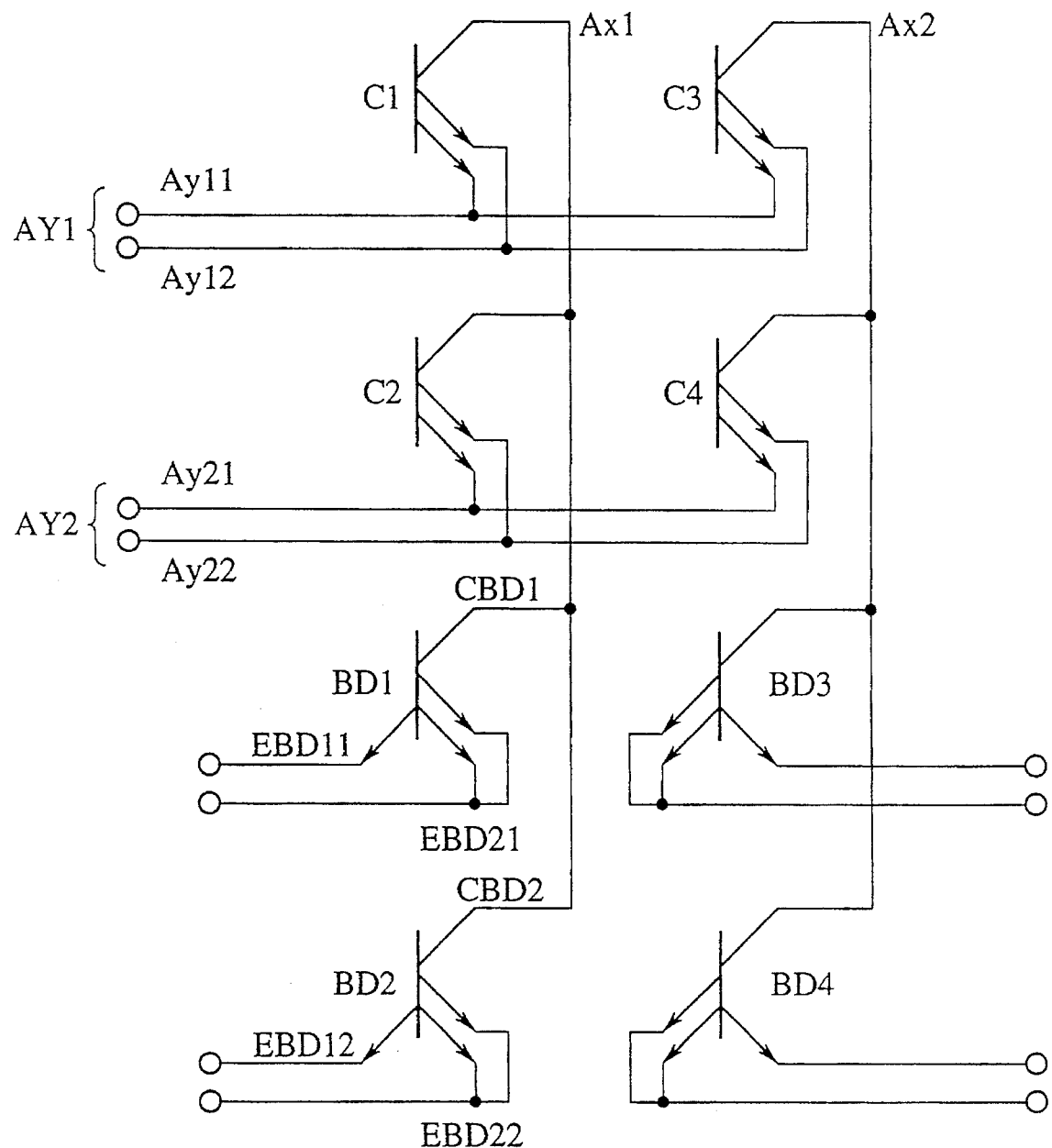
FIG. 29 is a view of a cell array with a couple of the row address signal line drivers, and a circuit diagram of such row address signal line drivers.

FIG. 29 shows an example where two row address signal line drivers BD are provided for one row address signal line.

As shown in FIG. 29, row address signal lines Ax1, Ax2 are arranged in the direction of rows, and pairs of two column address signal lines AY1, AY2 are arranged across the row address signal lines Ax1, Ax2 electrically unconnected therewith. Memory cells C1, C2, C3, C4 each comprising one transistor are formed at the respective intersections. On one end of each row address signal line AX, there are two row address signal line drivers BD1, BD2 (or BD3, BD4) having the same configuration and characteristics as the memory cell transistors.

The row address signal line drivers will be explained with respect to the row address signal line drivers BD1, BD2 connected to the row address signal line AX1.

The row address signal line driver BD1 comprises one transistor including one collector electrode CBD1, a smaller-area emitter electrode EBD11 and a larger-area emitter electrode EBD21. The row address signal line Ax1 is connected to the collector CBD1 of the transistor, and row address signals from a row address decoder 1 (not shown) are supplied to the two emitter electrodes EBD11, EBD21.

The row address signal line driver BD2 comprises one transistor including one collector electrode CBD2, and a smaller-area emitter electrode EBD12 and a larger-area emitter electrode EBD22. The row address signal line Ax1 is connected to the collector CBD2 of the transistor, and row address signals from the row address decoder 1 (not shown) are supplied to the two emitter electrodes EBD12, EBD22.

The transistors constituting the row address signal line drivers BD1, BD2 have basically the same structure as the double emitter transistors constituting the memory cells, and may be RHETs, or RBTs having emitter pn junctions with low backward breakdown voltage. Their difference from the transistors of the memory cells is that areas of the two emitter electrodes of each transistor are not the same; the emitters EBD11, EBD12 have a smaller area, and the emitters EBD21, EBD22 have a larger area.

[Writing at Stable Operating Point S2]

To select the memory cell C2 of the column address signal line AY2, depending on which of the stable operating points S1, S2 the cell is operating at, a low- or a high-level voltage is applied to the column address signal line AY2. When writing at stable operating point S2, a voltage of a level lower than the holding state is applied to the column address signal line AY2.

When writing at stable operating point S2, only the row address signal line driver BD1 connected to the row address signal line Ax1 is used, and the row address signal line driver BD2 is not used.

First, to select the row address signal line Ax1, a high-level voltage is applied to the larger-area emitter EBD21 of the row address signal line driver BD1. Then to select the column address signal line AY2, a low-level voltage is applied to the respective column address signal lines Ay21, Ay22. As a result, the memory cell C2 has the same state as shown in FIG. 25A or FIG. 25B, and writing can be conducted at stable operating point S2.

At this time, a voltage for the holding state is applied to another row address signal line driver BD2, but because the voltage of the row address signal line rises, the energy level of only the collector electrode rises, and the collector electrode is not involved in the writing operation.

[Writing at Stable Operating Point S1]

In writing when the cell is at stable operating point S1, a lower level voltage than that of the holding state is applied to the column address signal line AY2.

In writing when the cell is at stable operating point S1, only the row address signal line driver BD2 connected to the row address signal line Ax1 is used, and the row address signal line driver BD1 is not used.

First, to select the row address signal line Ax1, a low-level voltage is applied to the larger-area emitter EBD22 of the row address signal line driver BD2. Then, to select the column address signal line AY2, a high-level voltage is applied to the respective column address signal lines Ay21, Ay22. As a result, the memory cell C2 has the same state as shown in FIG. 26A or FIG. 26B, and writing at stable operating point S1 is enabled.

At this time, the voltage for the holding state is applied to another row address signal line driver BD1, but because the voltage of the row address signal line drops, the energy level of only the collector electrode is lowered, and the collector electrode is not involved in the writing operation.

Thus, according to the embodiment shown in FIG. 29, two row address signal line drivers BD1, BD2 are connected to one row address signal line Ax1 and are selectively used for writing when the cell is at stable operating points S1, S2. This makes it possible that one of the row address signal line drivers is operative on two levels of a middle-level voltage (Mid) and a low-level voltage (Low), and the other is operative on two levels of the middle-level voltage (Mid) and a high-level voltage (High).

As in the case where one row address signal line driver is used, the transistor BDTr of the row address signal line driver BD1 or BD2 is provided by a transistor having the same structure as the transistors Tr of the memory cells, whereby the holding state is set at 0 voltage, and a voltage to be applied when writing is conducted at stable operating state S1 or S2 can have equal positive and negative values. This facilitates design of the circuit.

Figure 30:
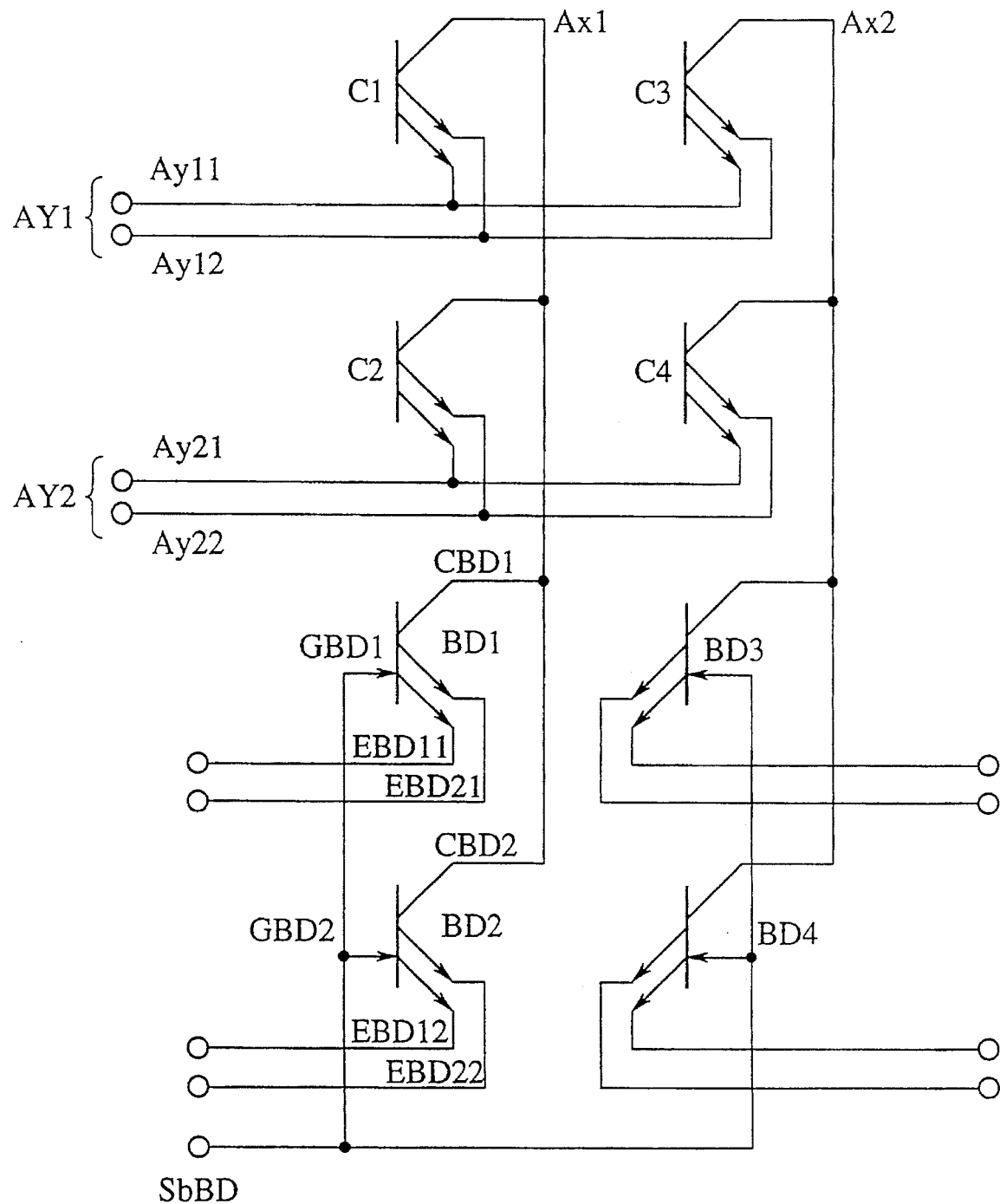
FIG. 30 is a view of a cell array including a couple of the row address signal line drivers with the gate added, and a circuit diagram of such row address signal line drivers.

In the embodiment shown in FIG. 29, the row address signal line drivers BD each comprise a transistor including a larger-area emitter electrode and a smaller-area emitter electrode. But it is possible that the two row address signal line drivers shown in FIG. 28, including the gate for electrically controlling an area of one of the emitters, are used to constitute the circuit of FIG. 30.

The embodiment shown in FIGS. 19 to 29 does not include in the memory cell a gate electrode for controlling the base current, but it is possible that the memory cell shown in FIG. 2 may be used to constitute a circuit having high reading and writing speed, and little electric power consumption.

[III] SRAM

Figure 31:
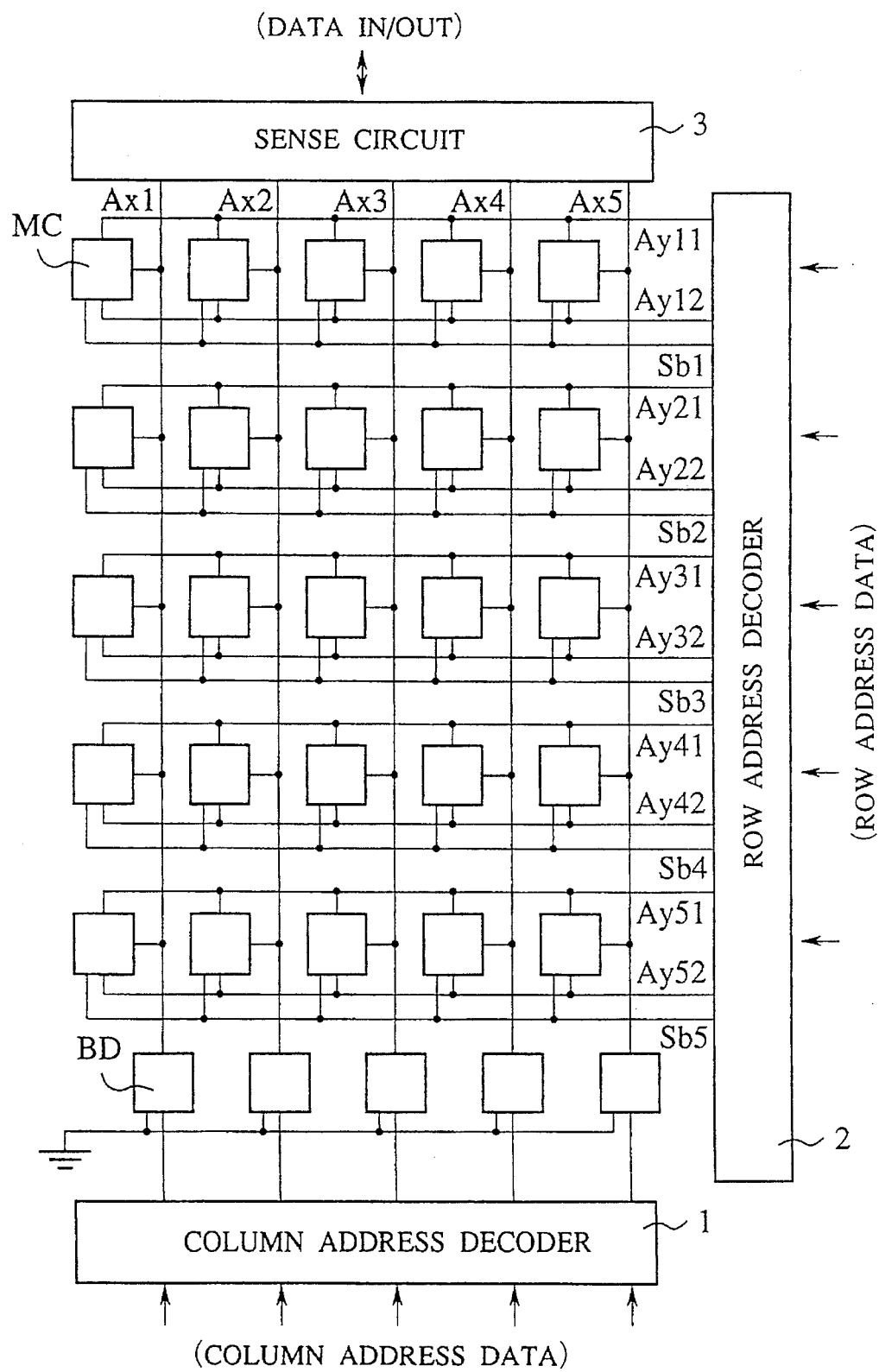
FIG. 31 is a block diagram of a circuit of the SRAM according to the present invention.

FIG. 31 shows an example of the SRAM using the memory cells of FIG. 1, and the row address signal line drivers BD in FIG. 19.

As shown in FIG. 31, row address signal lines Ax1–Ax5 are arranged row-wise, pairs of two column address signal lines Ay11–Ay52 are arranged across the row address signal lines electrically unconnected therewith, and standby signal lines Sb1–Sb5 are arranged in parallel with the column address signal lines Ay11–Ay52. Memory cells are formed at respective intersections. Each memory cell comprises base-emitter junction layers D1, D2, a base-collector junction layer D3, and a gate electrode G. Each memory cell has the structure shown in FIG. 1, and its explanation will not be repeated here.

A row address decoder 1 is connected to one end of the row address signal lines Ax through row address signal line drivers BD. The row address decoder 1 decodes row address data and applies a voltage corresponding to contents of the data. The row address signal line drivers BD have the structure of FIG. 19, and their explanation will not be repeated here.

A sense circuit 3 is connected to the other end of the row address signal lines Ax. The sense circuit 3 detects currents flowing through the respective column address signal lines Ax1–Ax5 to read information in the memory cells.

A column address decoder 2 is connected to the end of the column address signal lines Ay1, Ay2 and of the standby signal lines Sb. The column address decoder 2 decodes column address data and applies voltages corresponding to contents of the data, and on writing and reading information and in standby, the column address decoder 2 applies required voltages to the gate G.

Writing data in the memory cells is executed by supplying required row and column address data to their respective row and column address decoders 1 and 2 to select addresses where the data are to be stored. At this time, a standby signal which gives the gate G a positive or 0 potential is supplied to the appropriate standby signal line Sb. Modes of the application of voltages to the row address signal lines Ax and the column address signal lines Ay1, Ay2, and the writing operation are the same as shown in FIGS. 3 to 14, and their explanation will not be repeated here.

Reading data from the memory cells is conducted by supplying required row and column address data to the row address decoder 1 and the column address decoder 2 to select read-out address and detecting currents flowing through the row address signal lines Ax1–Ax5 by the sense circuit 3. At this time, a standby signal which gives the gate G a positive or 0 voltage is supplied to the appropriate standby signal line Sb.

Thus each memory cell can select addresses, so that data can be written in and read from memory cells at those required addresses. A positive or 0 voltage can be applied to the gate G through a standby signal line Sb, whereby more current flows through the base-emitter junction layers D1, D2 to speed up writing and reading.

Figure 32:
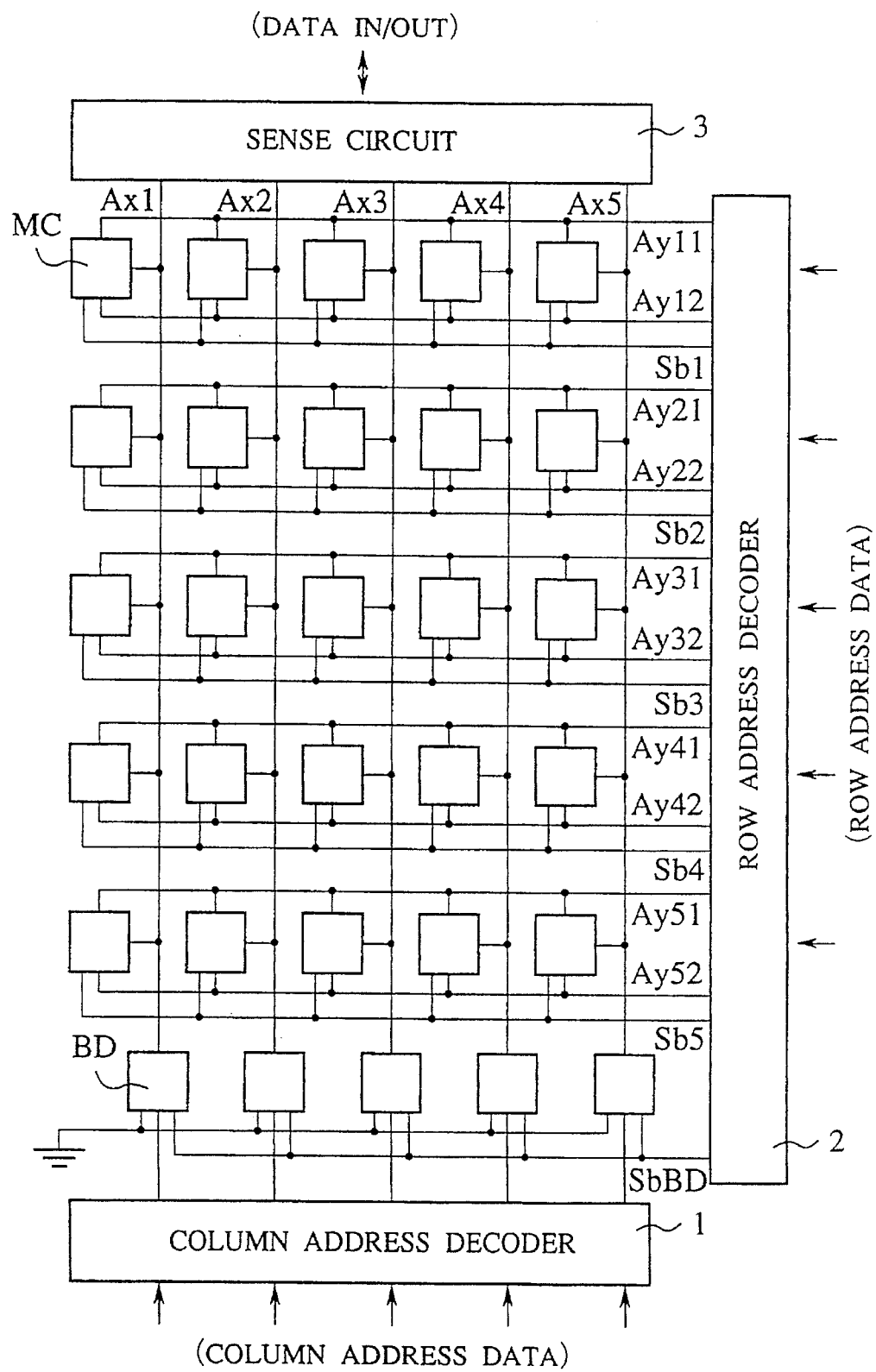
FIG. 32 is a block diagram of another circuit of the SRAM according to the present invention.

FIG. 32 shows a circuit diagram of a SRAM using the row address signal line drivers of FIG. 28. As shown in FIG. 31, a gate control signal line SbBD is connected to the respective row address signal line drivers, whereby the effective emitter electrode area can be changed.

What is claimed is:

1. A memory device comprising a row address signal line; a pair of column address signal lines; a memory cell provided at an area where the row address signal line intersects with the column address signal lines; and a row address signal line driver provided at one end of the row address signal lines, the memory cell comprising a memory transistor of double-emitter structure including one collector electrode and emitter electrodes, and exhibiting negative differential characteristic;

one of the emitter electrodes of the memory transistor being connected to one of the column address signal lines which is on a lower-voltage side, the other of the emitter electrodes being connected to the other of the column address signal lines which is on a higher-voltage side, the collector electrode of the memory transistor being connected to the address signal line;

the row address signal line driver comprising a driver transistor of a double-emitter structure which includes one collector electrode, and a smaller-area emitter electrode and a larger-area emitter electrode, and exhibits a negative differential characteristic; and the smaller-area emitter electrode of the driver transistor being grounded, and the collector electrode of the driver transistor being connected to the row address signal line.

2. A memory device comprising row address signal line; pairs of column address signal lines; a memory cell provided at an area where the row address signal line intersects with the column address signal lines; and a first row address signal line driver and a second row address signal line driver provided at one end of the row address signal line, the memory cell comprising a memory transistor of double-emitter structure each including one collector electrode and emitter electrodes, and exhibiting negative differential characteristic;

one of the emitter electrodes of the memory transistor being connected to one of the column address signal lines which is on a lower-voltage side, the other of the emitter electrodes being connected to the other of the column address signal lines which is on a higher-voltage side, the collector electrode of the memory transistor being connected to the address signal line;

the first row address signal line driver comprising a first driver transistor of a double-emitter structure which includes one collector electrode, and a smaller-area emitter electrode and a larger-area emitter electrode, and exhibits a negative differential characteristic;

the smaller-area emitter electrode of the first driver transistor being grounded, and the collector electrode of the driver transistor being connected to the row address signal line;

the second row address signal line driver being the same as the first row address signal line driver, and comprising a second driver transistor of a double-emitter structure which includes one collector electrode, and a smaller-area emitter electrode and a larger-area emitter electrode, and exhibits a negative differential characteristic; and the smaller-area emitter electrode of the second driver transistor being grounded, and the collector electrode of the second driver transistor being connected to the row address signal line.

3. A memory device according to claim 1, further comprising:

a gate control signal line for controlling a base current of the driver transistor, the row address signal line driver further includes a gate which is provided in said one emitter electrode, and changes an effective area of said one emitter electrode by an applied voltage, the gate being connected to the gate control signal line.

4. A memory device according to claim 2, further comprising:

a gate control signal line for controlling base currents of the first driver transistor and of the second driver transistor;

the first row address signal line driver further includes a gate which is provided in said one emitter electrode, and changes an effective area of said one emitter electrode by an applied voltage, the gate being connected to the gate control signal line, the second row address signal line driver further includes a gate which is provided in said one emitter, and changes an effective area of said one emitter electrode by an applied voltage, the gate being connected to the gate control signal line.

5. A memory device according to claim 1, further comprising:

a standby signal line;

the memory cell further includes a gate which controls a base current of the memory transistor by an applied voltage; and the gate being connected to the standby signal line.

6. A memory device according to claim 2, further comprising:

a standby signal line;

the memory cell further includes a gate which controls a base current of the memory transistor by an applied voltage; and the gate being connected to the standby signal line.

7. A memory device according to claim 3, further comprising:

a standby signal line;

the memory cell further includes a gate which controls a base current of the memory transistor by an applied voltage; and the gate being connected to the standby signal line.

8. A memory device according to claim 4, further comprising:

a standby signal line;

the memory cell further includes a gate which controls a base current of the memory transistor by an applied voltage; and the gate being connected to the standby signal line.

9. A memory device according to claim 1, wherein the driver transistor comprises a double-emitter type resonant tunneling hot electron transistor.

10. A memory device according to claim 2, wherein the driver transistor comprises double-emitter type resonant tunneling hot electron transistor.

11. A memory device according to claim 3, wherein the driver transistor comprises double-emitter type resonant tunneling hot electron transistor.

12. A memory device according to claim 4, wherein the driver transistor comprises double-emitter type resonant tunneling hot electron transistor.

13. A memory device according to claim 5, wherein the driver transistor comprises double-emitter type resonant tunneling hot electron transistor.

14. A memory device according to claim 6, wherein the driver transistor comprises double-emitter type resonant tunneling hot electron transistor.

15. A memory device according to claim 7, wherein the driver transistor comprises a double-emitter type remnant tunneling hot electron transistor.

16. A memory device according to claim 8, wherein the driver transistor comprises a double-emitter type resonant tunneling hot electron transistor.

17. A memory device according to claim 1, wherein the driver transistor comprises a double-emitter type resonant tunneling bipolar transistor.

18. A memory device according to claim 2, wherein the driver transistor comprises a double-emitter type resonant tunneling bipolar transistor.

19. A memory device according to claim 3, wherein the driver transistor comprises a double-emitter type resonant tunneling bipolar transistor.

20. A memory device according to claim 4, wherein the driver transistor comprises a double-emitter type resonant tunneling bipolar transistor.

21. A memory device according to claim 5, wherein the driver transistor comprises a double-emitter type resonant tunneling bipolar transistor.

22. A memory device according to claim 6, wherein the driver transistor comprises a double-emitter type resonant tunneling bipolar transistor.

23. A memory device according to claim 7, wherein the driver transistor comprises a double-emitter type resonant tunneling bipolar transistor.

24. A memory device according to claim 8, wherein the driver transistor comprises a double-emitter type resonant tunneling bipolar transistor.

25. A method for writing information in a memory device according to claim 1 in which when information is written in stable operating point, on the negative side of two stable and unstable operating points generated by base-emitter junction layers of the memory cell, a low-level voltage is applied to the larger-area emitter electrode so that emitter electrodes of the driver transistor have a bistable state, and a high-level voltage is applied to the row address signal lines;

when information is written in stable operating point, on the positive side of said stable operating points, high-level voltage is applied to the larger-area emitter electrode so that the emitter electrodes of the first driver transistor have a bistable state, and a low-level voltage is applied to the row address signal lines.

26. A method for writing information in a memory device according to claim 2, wherein when information is written in stable operating point, on the negative side of two stable and one unstable operating points generated by base-emitter junction layers of the memory cell, a low-level voltage is applied to the larger-area emitter electrode so that the emitter electrodes of the first driver transistor have a bistable state, and a high-level voltage is applied to the row address signal lines;

when information is written in stable operating point, on the positive side, of said stable operating points, a high-level voltage is applied to the larger-area emitter electrode so that the emitter electrodes of the second driver transistor have a bistable state, and a low-level voltage is applied to the row address signal lines.

27. A method for writing information in a memory device according to claim 3, wherein when information is written in stable operating point, on the negative side of two stable and one unstable operating points generated by base-emitter junction layers of the memory cell, a negative voltage is applied to the gate control signal line, a low-level voltage is applied to the effectively larger-area emitter electrode so that the two emitter electrodes the driver transistor have a bistable state and high-level voltage is applied to the row address signal lines;

when information is written in stable operating point, on the positive side of said stable operating points, a negative voltage is applied to the gate control signal line, a high-level voltage is applied to the effectively larger-area emitter electrode so that the emitter electrodes of the driver transistor have a bistable state, and a low-level voltage is applied to the row address signal lines.

28. A method for writing information in a memory device according to claim 4, wherein when information is written in stable operating point, on the negative side of two stable and one unstable operating points generated by base-emitter junction layers of the memory cell, a negative voltage is applied to the gate control signal line, a low-level voltage is applied to the effectively larger-area emitter electrode so that the two emitter electrodes of the first driver transistor have a bistable state, and a high-level voltage is applied to the row address signal lines;

when information is written in a stable operating point, on the positive side of said stable operating points, a negative voltage is applied to the gate control signal line, a high-level voltage is applied to the effectively larger-area emitter electrode so that the two emitter electrodes of the second driver transistor have a bistable state, and a low-level voltage is applied to the row address signal lines.

29. A memory device comprising:

row address signal lines comprising a plurality of signal lines;

column address signal lines comprising pairs of signal lines arranged across the row address signal lines;

a plurality of memory cells provided at respective areas where the row address signal lines intersect with the column address signal lines, respective memory cell comprising a memory transistor of double-emitter structure including one collector electrode and emitter electrodes, and exhibiting negative differential characteristic, one of the emitter electrodes of the memory transistor being connected to one of the respective column address signal lines which is on a lower-voltage side, the other of the emitter electrodes being the other of the respective column address signal lines which is on a higher-voltage side, the collector electrode of the memory transistor being connected to the respective address signal line;

a plurality of row address signal line drivers according to claim 1 which are provided on one end of the row address signal lines;

a row address decoder for supplying row address signals to the row address signal lines;

a column address decoder for supplying column address signals to the column address signal lines; and a sense circuit for detecting stored information in the respective memory cells from the row address signal lines.

30. A memory device comprising:

row address signal lines comprising a plurality of signal lines;

column address signal lines comprising pairs of signal lines arranged across the row address signal lines;

a plurality of memory cells provided at respective areas where the row address signal lines intersect with the column address signal lines, respective memory cell comprising a memory transistor of double-emitter structure including one collector electrode and emitter electrodes, and exhibiting negative differential characteristic, one of the emitter electrodes of the memory transistor being connected to one of the respective column address signal lines which is on a lower-voltage side, the other of the emitter electrodes being connected to the other of the respective column address signal lines which is on a higher-voltage side, the collector electrode of the memory transistor being connected to the respective address signal line;

a plurality of row address signal line drivers according to claim 2 which are provided on one end of the row address signal lines;

a row address decoder for supplying row address signals to the row address signal lines;

a column address decoder for supplying column address signals to the column address signal lines; and a sense circuit for detecting stored information in the respective memory cells from the row address signal lines.

31. A memory device comprising:

row address signal lines comprising a plurality of signal lines;

column address signal lines comprising pairs of signal lines arranged across the row address signal lines;

a plurality of memory cells provided at respective areas where the row address signal lines intersect with the column address signal lines, respective memory cell comprising a memory transistor of double-emitter structure including one collector electrode and emitter electrodes, and exhibiting negative differential characteristic, one of the emitter electrodes of the memory transistor being connected to one of the respective column address signal lines which is on a lower-voltage side, the other of the emitter electrodes being connected to the other of the respective column address signal lines which is on a higher-voltage side, the collector electrode of the memory transistor being connected to the respective address signal line;

a plurality of row address signal line drivers according to claim 3 which are provided on one end of the row address signal lines;

a row address decoder for supplying row address signals to the row address signal lines;

a column address decoder for supplying column address signals to the column address signal lines; and a sense circuit for detecting stored information in the respective memory cells from the row address signal lines.

32. A memory device comprising:

row address signal lines comprising a plurality of signal lines;

column address signal lines comprising pairs of signal lines arranged across the row address signal lines;

a plurality of memory cells provided at respective areas where the row address signal lines intersect with the column address signal lines, respective memory cell comprising a memory transistor of double-emitter structure including one collector electrode and emitter electrodes, and exhibiting negative differential characteristic, one of the emitter electrodes of the memory transistor being connected to one of the respective column address signal lines which is on a lower-voltage side, the other of the emitter electrodes being connected the other of the respective column address signal lines which is on a higher-voltage side, the collector electrode of the memory transistor being connected to the respective address signal line;

a plurality of row address signal line drivers according to claim 4 which are provided on one end of the row address signal lines;

a row address decoder for supplying row address signals to the row address signal lines;

a column address decoder for supplying column address signals to the column address signal lines; and a sense circuit for detecting stored information in the respective memory cells from the row address signal lines.

33. A memory device comprising row address signal line; pairs of column address signal lines; a memory cell provided at an area where the row address signal line intersects with the column address signal lines; and a first row address signal line driver and a second row address signal line driver provided at one end of the row address signal line, the memory cell comprising a memory transistor of double-emitter structure each including one collector electrode and emitter electrodes, and exhibiting negative differential characteristics;

one of the emitter electrodes of the memory transistor being connected to one of the column address signal lines which is on a lower-voltage side, the other of the emitter electrodes of the memory transistor being connected to the other of the column address signal lines which is on a higher-voltage side, the collector electrode of the memory transistor being connected to the address signal line;

the first row address signal line driver comprising a first driver transistor of a double emitter structure which includes one collector electrode, a first emitter electrode and a second emitter electrode, and a base layer, and exhibits a negative differential characteristic;

said double emitter structure of said first transistor having a first emitter and a second emitter, said second emitter of said first driver transistor having a peak current, said peak current of said second emitter electrode of said first driver transistor having negative differential characteristics when the second emitter electrode is biased negative relative to the base layer; and said first emitter of said first driver transistor having a peak current; said peak current of said second emitter of said first driver transistor being larger than said peak current of said first emitter of said first driver transistor when said first emitter electrode of said first driver transistor is biased positive relative to the base layer;

the collector electrode the driver transistor being connected to the row address signal line;

the second row address signal line driver being the same as the first row address signal line driver, and comprising a second driver transistor of a double-emitter structure which includes one collector electrode, a first emitter electrode and a second emitter electrode, and a base layer, and exhibits a negative differential characteristic;

said double emitter structure of said second driver transistor having a first emitter and a second emitter, said second emitter of said second driver transistor having a peak current, said peak current of said second emitter electrode of said second driver transistor having negative differential characteristics when the second emitter electrode is biased positive relative to the base layer; and said first emitter of said, second driver transistor having a peak current; said peak current of said second emitter of said second driver transistor being larger than said peak current of said first emitter of said second driver transistor when said first emitter electrode of said second driver transistor is biased negative relative to the base layer; and the collector electrode of the second driver transistor being connected to the row address signal line.

34. A method for writing information in a memory device according to claim 33, wherein when information is written in stable operating point, on the negative side of two stable and one unstable operating points generated by base-emitter junction layers of the memory cell, a low-level voltage is applied to the second emitter electrode so that the emitter electrodes of the first driver transistor have a bistable state, and a high-level voltage is applied to the row address signal lines;

when information is written in stable operating point, on the positive side, of said stable operating points, a high-level voltage is applied to the second emitter electrode so that the emitter electrodes of the second driver transistor have a bistable state, and a low-level voltage is applied to the row address signal lines.

* * * * *